United States Patent [19]

Yanagiuchi

[11] Patent Number: 6,094,081
[45] Date of Patent: Jul. 25, 2000

[54] DIGITAL CONTROLLED OSCILLATION CIRCUIT AND PLL CIRCUIT

[75] Inventor: Hiroshi Yanagiuchi, Kanagawa, Japan

[73] Assignee: Sony Corporation, Tokyo, Japan

[21] Appl. No.: 09/145,886

[22] Filed: Sep. 2, 1998

[30] Foreign Application Priority Data

Sep. 3, 1997 [JP] Japan ..................................... 9-238069

[51] Int. Cl.[7] .................................................. H03K 5/13
[52] U.S. Cl. .......................... 327/258; 327/107; 327/259; 331/57
[58] Field of Search .................................... 327/258, 259, 327/105, 107, 291, 106, 256, 257; 331/57, 60

[56] References Cited

U.S. PATENT DOCUMENTS

| | | | |
|---|---|---|---|
| 5,155,379 | 10/1992 | Narahara .................................. | 327/259 |
| 5,357,204 | 10/1994 | Knoll ...................................... | 327/259 |
| 5,920,216 | 7/1999 | Fischer .................................... | 327/158 |

*Primary Examiner*—Tuan T. Lam
*Attorney, Agent, or Firm*—Ronald P. Kananen; Rader, Fishman & Grauer

[57] ABSTRACT

A digital controlled oscillation circuit which has a wide oscillation frequency range and continuous and smooth transition of the oscillation frequency and can prevent occurrence of jitter: in which provision is made of a first delay circuit for delaying a first signal by a control signal and outputting the same as a first delay signal; a second delay circuit for delaying a second signal by the control signal and outputting the same as a second delay signal; an RS FF which switches a first output signal from low to high and switches a second output signal from high to low and outputs the same when receiving as its input the first delay signal, while switches the first output signal from high to low and switches the second output signal from low to high and outputs the same when receiving as its input the second delay circuit; and first and second switching detection circuits for generating first and second delay circuits when detecting that the first and second output signals switch from high to low.

12 Claims, 15 Drawing Sheets

DIGITAL CONTROLLED OSCILLATION CIRCUIT AND PLL CIRCUIT

BACKGROUND OF THE INVENTION

1. Field of the Invention

The present invention relates to a digital controlled oscillation circuit using a digital delay circuit and to a PLL circuit using the same.

2. Description of the Related Art

Oscillators used in PLL (phase locked loop) circuits etc. are required to have the characteristics of a smooth transition of frequency by a control signal and a wide oscillation frequency range. Further, there must be no jitter due to changes in the control signal.

For this reason, almost all of the oscillators used in the circuits of the prior art are voltage controlled oscillators (VCO) which control the oscillation frequency by a voltage signal, that is, an analog value.

In the case of a digital PLL circuit, a so-called digital controlled oscillator (DCO) enabling direct controlling of the oscillation frequency of the oscillator by a digital signal has been used.

FIG. 14 shows an example of a PLL circuit using a digital controlled oscillator (hereinafter simply referred to as a DCO).

As shown in FIG. 14, the PLL circuit 1 of the present example is constituted by a phase comparator 2, a digital counter 3, and a DCO 4.

The phase comparator 2 compares the phases of a reference signal $S_{ref}$ input from the outside and an oscillation signal $S_O$ from the DCO 4, generates an up signal $S_{up}$ or a down signal $S_{dw}$ in accordance with the result of comparison, and outputs the same to the digital counter 3.

The digital counter 3 receives the up signal $S_{up}$ or down signal $S_{dw}$ from the phase comparator 2, generates for example an n-bit count value $S_C$ in accordance with the level of these signals, and outputs the same to the DCO 4.

The DCO 4 receives the count value $S_C$ from the digital counter 3, sets the oscillation frequency in accordance with this, generates an oscillation signal $S_o$ of the set frequency, and outputs the same to the phase comparator 2.

In the PLL circuit 1 shown in FIG. 14, the phase comparator 2 compares the phases of the reference signal $S_{ref}$ input from the outside and the oscillation signal $S_C$ generated from the DCO 4, generates an up signal $S_{up}$ or down signal $S_{dw}$ in accordance with the result of comparison, and outputs the same to the digital counter 3. The digital counter 3 generates an n-bit count value $S_C$. The count value $S_C$ is fed back to the DCO 4, and the oscillation frequency of the DCO 4 is controlled in accordance with this.

Accordingly, the phase of the oscillation signal $S_C$ generated by the DCO 4 follows the phase of the reference signal $S_{ref}$ input to the phase comparator 2.

As explained above, in the same way as the PLL circuit using the voltage controlled oscillator (VCO) of the related art, an oscillation signal following the phase of the input reference signal can be generated by a PLL circuit provided with the digital controlled oscillator (DCO) shown in FIG. 14.

Below, the configuration and operation of a generally used DCO will be simply explained by referring to FIG. 15 to FIG. 17.

FIG. 15 is a circuit diagram showing an example of a DCO constituted by using a plurality of delay elements imparting different delay times and selectors imparting inverted outputs.

As shown in FIG. 15, the DCO of the present example is constituted by connecting for example n number of delay stages constituted by delay elements $D_i$ (i=n−1, n−2, ..., 2, 1, 0) and selectors $SEL_i$ in series.

Note that, here, n is an even number.

As illustrated, in the DCO of the present example, one input terminal A of the selector $SEL_i$ constituting each delay stage is connected to an output terminal of the selector of the former stage, while the other input terminal B is connected to the output terminal of the delay element $D_i$. The input terminal of the delay element $D_i$ is connected to the output terminal of the selector of the former stage.

Note that, the input terminal A of the selector $SEL_{n-1}$ of an initial stage is connected to the output terminal of a NAND gate NGT, while the input terminal B is connected to the output terminal of the NAND gate NGT via the delay element $D_{n-1}$.

Further, the output terminal of the selector $SEL_0$ of a final stage is connected to one input terminal of the NAND gate NGT, while an enable signal ENB is input to the other input terminal of the NAND gate NGT.

Further, the output terminal of the NAND gate NGT is connected to the output terminal $T_{out}$ of the oscillation signal $S_0$ via an inverter INV.

Bit data $C_{n-1}$, $C_{n-2}$, ..., $C_2$, $C_1$, and $C_0$ of for example an n-bit count value SC are respectively input to the selected signal input terminals CK of the selectors $SEL_{n-1}$, $SEL_{n-2}$, ..., $SEL_2$, $SEL_1$, and $SEL_0$. Each selector selects the signal of the input terminal A or the input terminal B in accordance with the level of the signal input to the selected signal input terminal and outputs the inverted signal thereof.

For example, when a signal of a low level is input to the selected signal input terminal CK, the selector selects the signal input to the input terminal A, inverts this, and outputs the same to the output terminal. Conversely, when a signal of a high level is input to the selected signal input terminal CK, the selector selects the signal input to the input terminal B, inverts this, and outputs the same to the output terminal.

Further, when assuming that the delay time of a delay element $D_0$ is $T_D$, the delay time of the delay element $D_i$ becomes $2^i T_D$. For example, the delay time of the delay element $D_{n-1}$ becomes $2^{n-1} T_D$, and the delay time of a delay element $D_1$ becomes $2T_D$.

By the above DCO, the delay time of the signal from the output terminal of the NAND gate NGT to the output terminal of the selector SEL0 of the final stage is set in accordance with the level of the bit data $C_{n-1}, C_{n-2}, ..., C_2, C_1$, and $C_0$ of the count value $S_C$. When an enable signal ENB of a high level is input to the NAND gate NGT, a ring oscillator is constituted by the delay stages and the NAND gate NGT and oscillates with the oscillation frequency controlled by the count value $S_C$.

FIG. 16 is a circuit diagram showing an example of the configuration of another DCO.

As shown in FIG. 16, the DCO of the present example is constituted by the NAND gate NGT and n number of delay elements $DLY_{n-1}$, $DLY_{N-2}$, ..., $DLY_{N-2}$, $DLY_{N-1}$, and $DLY_0$ connected in series and the output terminal of the delay element $DLY_0$ is connected to the input terminal of the NAND gate NGT, whereby a ring oscillator is constituted.

Note that, here, n is an even number in the same way as the above example.

The delay elements $DLY_{n-1}$, $DLY_{n-2}$, ..., $DLY_2$, $DLY_1$, and $DLY_0$ have a similar configuration. FIG. 17 shows the configuration thereof taking the delay element $DLY_0$ as an example.

As illustrated, the delay element $DLY_0$ is constituted by nMOS transistors $Tn_{n-1}, Tn_{n-2}, \ldots, Tn_{n-2}, Tn_{n-1}, Tn_0$, and $Tn_{00}$ and pMOS transistors $Tp_{n-1}, Tp_{n-2}, \ldots, Tp_{n-2}, Tp_{n-1}, Tp_0$, and $Tp_{00}$.

The pMOS transistors $Tp_{n-1}, Tp_{n-2}, \ldots, TP_2, Tp_1$, and $Tp_0$ are connected in parallel between the supply line of the power supply voltage $V_{cc}$ and a node NDp. Namely, sources of the pMOS transistors $Tp_{n-1}, Tp_{n-2}, \ldots, Tp_2, Tp_1$, and $Tp_0$ are connected to the supply line of the power supply voltage $V_{cc}$, and drains are connected to a node NDp. Further, inverted signals $/C_{n-1}, /Cn_{n-2}, \ldots, /C_2, /C_1$, and $/C_0$ of the bit data $C_{n-1}, C_{n-2}, \ldots, C_2, C_1$, and $C_0$ of the count value $S_C$ are input to gates of these pMOS transistors.

The source of the pMOS transistor $Tp_{00}$ is connected to the node NDp, and the drain is connected to the output terminal $T_{out}$.

The nMOS transistors $Tn_{n-1}, Tn_{n-2}, \ldots, Tn_2, Tn_1$, and $Tn_0$ are connected in parallel between the supply line of the ground voltage GND and the node NDn. Namely, sources of the nMOS transistors $Tn_{n-1}, Tn_{n-2}, \ldots, Tn_2, Tn_1$, and $Tn_0$ are connected to the supply line of the ground voltage GND, and drains are connected to the node NDn. Further, bit data $C_{n-1}, C_{n-2}, \ldots, C_2, C_1$, and $C_0$ of the count value $S_C$ are input to gates of these nMOS transistors.

The drain of the nMOS transistor $Tn_{00}$ is connected to the output terminal $T_{ts}$ and the source is connected to the node NDn.

Namely, the drain of the nMOS transistor $Tn_{00}$ and the drain of the pMOS transistor $Tp_{00}$ are commonly connected to the output terminal $T_{out}$ of the delay element. Further, the gate of the nMOS transistor $Tn_{00}$ and the gate of the pMOS transistor $Tp_{00}$ are commonly connected to the input terminal $T_{in}$.

In the delay element shown in FIG. 16, the nMOS transistor $Tn_{00}$ and the pMOS transistor $Tp_{00}$ act as drive use transistors.

The conductive states of the pMOS transistors $Tp_{n-1}, Tp_{n-2}, \ldots, Tp_2, Tp_1$, and $Tp_0$ and the nMOS transistors $Tn_{n-1}, Tn_{n-2}, \ldots, Tn_2, Tn_1$, and $Tn_0$ are set in accordance with the levels of the bit data $C_{n-1}, C_{n-2}, \ldots, C_2, C_1$, and $C_0$ of the count value $S_C$.

Further, the transistors are set so that they respectively differ in size, for example, the channel widths, therefore, in accordance with the on/off state of each transistor, for example, the ratio of a resistance value between the supply line of the power supply voltage $V_{cc}$ and the node NDp and the resistance value of the drive use pMOS transistor $Tp_{00}$ changes. Similarly, the ratio of the resistance value between the ground line and the node NDn and the resistance value of the drive use nMOS transistor $Tn_{00}$ changes. Therefore, the delay time until the inverted signal of the signal input to the input terminal $T_{in}$ is output to the output terminal $T_{out}$ is controlled in accordance with the change of this resistance ratio.

Namely, the delay time of the delay elements $DLY_{n-1}$, $DLY_{n-2}, \ldots, DLY_2, DLY_1$, and $DLY_0$ is controlled by the count value $S_C$ input to the delay elements.

For this reason, when an enable signal ENB of a high level is input to the NAND gate NGT, a ring oscillator is constituted by the delay elements and NAND gate NGT and oscillates with an oscillation frequency controlled by the count value $S_C$.

However, the above DCOs each have their own disadvantages.

For example, in the DCO shown in FIG. 15, a wide range of the oscillation frequency can be taken, but since the path of the signals is dynamically switched, when the value of any bit of the count value $S_C$ changes, there is a danger that the signal will be momentarily interrupted, so there is a problem in continuity of the signal.

Further, during operation, the circuit as a whole is not stable in state. Jitter occurs due to the switching (change) of the value of the control signal.

Further, in the DCO shown in FIG. 16, the frequency transition of the oscillation signal is continuous and smooth, but the currents of the delay elements are considerably affected by the resistances of the drive use transistors $Tp_{00}$ and $Tn_{00}$, so there is a problem that a wide oscillation frequency range cannot be obtained.

In order to obtain a wide oscillation frequency range in the DCO shown in FIG. 16, it is necessary to make the resistances of the drive use transistors $Tp_{00}$ and $Tn_{00}$ small, that is, make the sizes of the transistors large. This consequently induces an increase of power consumption of the delay elements. Further, where transistors are actually formed on a substrate, there is a limit to the size of the transistors.

Further, during operation, the circuit as a whole is not stable in state. Jitter occurs due to the switching (change) of the value of the control signal.

SUMMARY OF THE INVENTION

An object of the present invention is to provide a digital controlled oscillation circuit in which the oscillation frequency range is wide, the transition of the oscillation frequency is continuous and smooth, and in addition occurrence of Jitter due to the change of the digital control signal can be prevented.

According to the present invention, there is provided a digital controlled oscillation circuit in which the oscillation frequency is controlled in accordance with a control signal, having a first delay circuit for delaying a first signal by exactly a delay time set by the control signal and outputting the same as a first delay signal; a second delay circuit for delaying a second signal by exactly the delay time set by the control signal and outputting the same as a second delay signal; an output signal generation circuit which switches a first output signal from a first level to a second level and outputs the same and, switches a second output signal from the second level to the first level and outputs the same when receiving the first delay signal, while switches the first output signal from the second level to the first level and outputs the same and, switches the second output signal from the first level to the second level and outputs the same when receiving the second delay signal; a first switching detection circuit for generating the first signal and outputting the same to the first delay circuit when detecting that the first output signal is switched from the second level to the first level; and a second switching detection circuit for generating the second signal and outputting the same to the second delay circuit when detecting that the second output signal is switched from the second level to the first level.

In the present invention, the control signal is an n (n is a positive integer) bit digital signal. The above first and second delay circuits are comprised of cascade connections of numbers of delay elements provided corresponding to the number of bits of the control signal and controlled in delay time in accordance with the corresponding bit data.

Further, in the present invention, the output signal generation circuit is constituted by a reset-set (RS) type flip-flop which receives as input the first delay signal at a set terminal, receives as input the second delay signal at a reset terminal, outputs the first output signal from a non-inverted output terminal, and outputs the second output signal from an inverted output terminal.

Further, in the present invention, the circuit comprises a circuit for correcting a deviation of times taken in set and reset operations of the RS type flip-flop.

Further, in the present invention, the circuit comprises a gate circuit for inputting the first delay signal or a first external signal to the output signal generation circuit. The output signal generation circuit switches the first output signal from the first level to the second level and outputs the same and, switches the second output signal from the second level to the first level and outputs the same when receiving the first delay signal or first external signal.

Further, in the present invention, the circuit comprises a gate circuit for inputting the second delay signal or a second external signal to the output signal generation circuit; and the output signal generation circuit switches the first output signal from the second level to the first level and outputs the same and, switches the second output signal from the first level to the second level and outputs the same when receiving the second delay signal or second external signal.

Further, in the present invention, the circuit comprises a storage circuit which receives external data, updates the value of the data and holds the value immediately before the updating when the first output signal is at the first level, and interrupts the updating of the value and outputs the value updated immediately before this as the control signal to the first delay circuit when the first output signal becomes the second level.

Further, in the present invention, the circuit comprises a storage circuit which receives external data, updates the value of the data and holds the value immediately before the updating when the second output signal is at the first level, and interrupts the updating of the value and outputs the value updated immediately before this as the control signal to the second delay circuit when the second output signal becomes the second level.

Further, in the present invention, the circuit comprises a pre-delay circuit for performing interpolation of the delay step of the delay circuit at least at one input side of the first delay circuit and the second delay circuit.

Further, the PLL circuit of the present invention has a phase comparator for comparing phases of a reference signal and an oscillation signal and generating an up signal or a down signal in accordance with the result of comparison; a digital counter which receives the up signal or down signal from the phase comparator and generates n-bit count data in accordance with the level of these signals; and digital controlled oscillation circuit having a first delay circuit for delaying a first signal by exactly a delay time set by the count data by the digital counter and outputting the same as a first delay signal; a second delay circuit for delaying a second signal by exactly the delay time set by the count data by the digital counter and outputting the same as a second delay signal; an output signal generation circuit which switches the first output signal from a first level to a second level and outputs the same and, switches the second output signal from the second level to the first level and outputs the same when receiving the first delay signal, while switches the first output signal from the second level to the first level and outputs the same and, switches the second output signal from the first level to the second level and outputs the same when receiving the second delay signal; a first switching detection circuit for generating the first signal and outputting the same to the first delay circuit when detecting that the first output signal is switched from the second level to the first level; and a second switching detection circuit for generating the second signal and outputting the same to the second delay circuit when detecting that the second output signal is switched from the second level to the first level.

According to the digital controlled oscillation circuit of the present invention, for example, a reset state is held by an external reset signal (second external signal) with respect to the output signal generation circuit, whereby the first output signal is output at the first level, and the second output signal is output at the second level.

In this state, the first output signal is switched from the first level to the second level and output from the output signal generation circuit to the first switching detection circuit by for example an enable signal from the outside (first external signal), and the second output signal is switched from the second level to the first level and output to the second switching detection circuit.

At this time, since the first output signal is a signal switched from the first level to the second level, the first signal is not generated in the first switching detection circuit.

Contrary to this, since the second output signal is a signal switched from the second level to the first level, the switching at the second switching detection circuit is detected. By this, the second signal is generated and output to the second delay circuit.

In the second delay circuit, the signal is delayed by exactly the time prescribed by the control signal and input as the second delay signal to the output generation circuit. By this, the first output signal is switched from the second level to the first level and output to the first switching detection circuit, while the second output signal is switched from the first level to the second level and output to the second switching detection circuit.

At this time, since the first output signal is a signal switched from the second level to the first level, the switching thereof is detected at the first switching detection circuit. By this, the first signal is generated and output to the first delay circuit.

Contrary to this, since the second output signal is a signal switched from the first level to the second level, the second signal is not generated in the second switching detection circuit.

In the first delay circuit, the first signal is delayed by exactly the time prescribed by the control signal and input as the first delay signal to the output signal generation circuit. By this, the first output signal is switched from the first level to the second level and output to the first switching detection circuit, while the second output signal is switched from the second level to the first level and output to the second switching detection circuit.

At this time, since the first output signal is a signal switched from the first level to the second level, the first signal is not generated in the first switching detection circuit.

Contrary to this, since the second output signal is a signal switched from the second level to the first level, the switching thereof is detected at the second switching detection circuit. By this, the second signal is generated and output to the second delay circuit.

In the second delay circuit, the second signal is delayed by exactly the time prescribed by the control signal and input as the second delay signal. By this, the first output signal is switched from the second level to the first level and output to the first switching detection circuit, while the second output signal is switched from the first level to the second level and output to the second switching detection circuit.

The above operation is repeatedly carried out. The output signal generation circuit generates a clock signal of a cycle determined by the delay by the first and second delay circuits.

Further, according to the present invention, the storage circuit receives external data, updates the value of the data, and holds the value immediately before updating when the first output signal and the second output signal are the first level. When the first output signal and the second output signal become the second level, the updating of the value is interrupted and the value updated immediately before this is output as the control signal to the first and second delay circuits.

By this, the control signal changes when the first and second delay circuits are stable in state, therefore there is no temporary break in the signal path and the circuit is resistant to jitter occurring due to a change of the control signal.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments will be described with reference to the accompanying drawings.

First Embodiment

Figure 1:
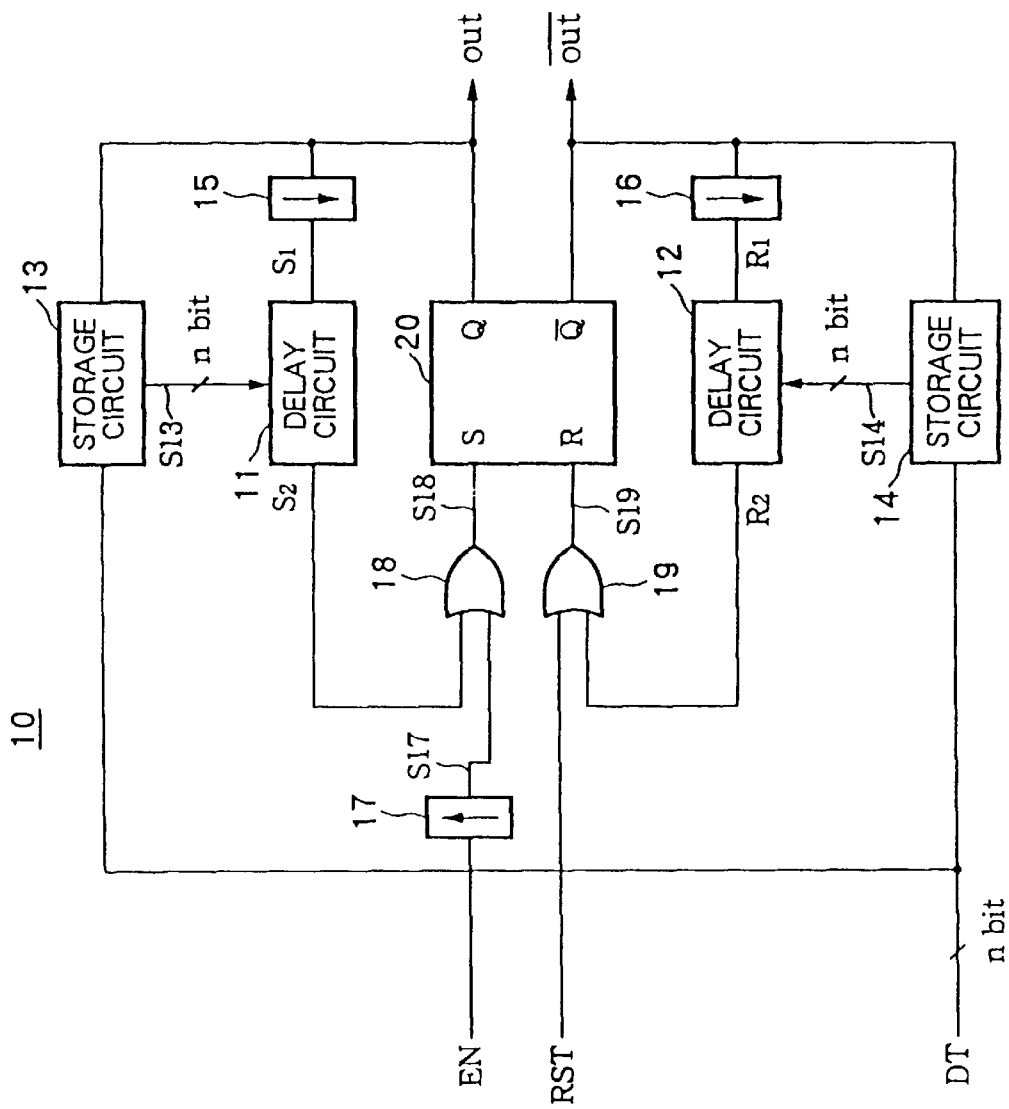
FIG. 1 is a circuit diagram showing a first embodiment of a digital controlled oscillation circuit according to the present invention.

FIG. 1 is a circuit diagram showing a first embodiment of a digital controlled oscillation circuit according to the present invention.

As shown in FIG. 1, a digital controlled oscillation circuit (DCO) 10 of the first embodiment is constituted by a first delay circuit 11, a second delay circuit 12, a first storage circuit 13, a second storage circuit 14, a first switching detection circuit 15, a second switching detection circuit 16, a rising edge detection circuit 17, a first OR gate circuit 18, a second OR gate circuit 19, and a reset-set (RS) type flip-flop 20 as the output signal generation circuit.

The first delay circuit 11 delays the first pulse signal $S_1$ of the first switching detection circuit 15 by exactly the delay time set by the control signal S13 of the first storage circuit 13 and outputs the same as a first delay signal $S_2$.

The second delay circuit 12 delays the second pulse signal $R_1$ of the second switching detection circuit 16 by exactly the delay time set by the control signal S14 of the second storage circuit 14 and outputs the same as a second delay signal $R_2$.

Note that the control signals S13 and S14 are n (n is a positive integer) bit digital signals and that the first and second delay circuits 11 and 12 are comprised of cascade connections of numbers of delay elements provided corresponding to the number of bits of the control signal and controlled in delay time in accordance with the corresponding bit data.

FIG. 2 to FIG. 5 are circuit diagrams showing examples of the configurations of the first and second delay circuits 11 and 12.

Figure 2:
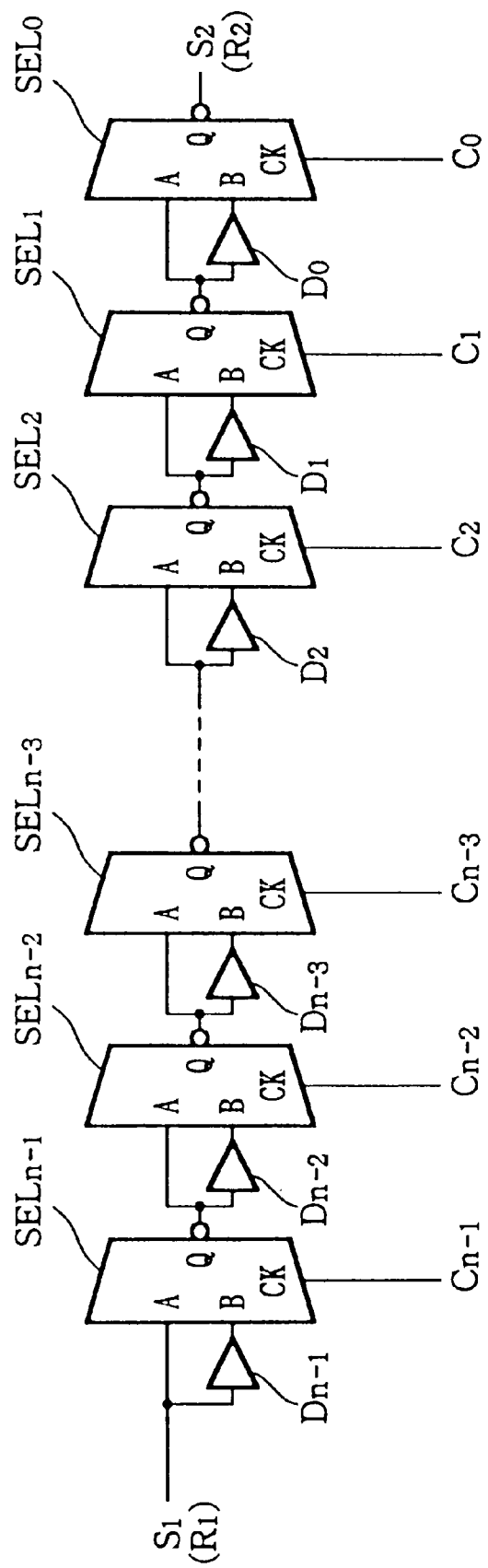
FIG. 2 is a circuit diagram showing a first example of the configuration of a delay circuit according to the present invention.

FIG. 2 is a circuit diagram showing a first example of the configuration of a delay circuit constituted by using a plurality of delay elements imparting different delay times and selectors imparting inverted outputs.

As shown in FIG. 2, the delay circuit of the present example is constituted by for example connecting n number of delay stages constituted by delay elements $D_i$ (i=n-1, n-2, . . . , 2, 1, 0) and selectors $SEL_i$ in series.

Note that, here, n is an even number.

As illustrated, in the delay circuit of the present example, one input terminal A of the selector $SEL_i$ constituting each delay stage is connected to the output terminal of the selector of the former stage, while the other input terminal B is connected to the output terminal of the delay element $D_i$. The input terminal of the delay element $D_i$ is connected to the output terminal of the selector of the former stage.

Note that the input terminal A of the selector $SEL_{n-1}$ of the initial stage is connected to the input line of the first pulse signal $S_1$ (second pulse signal $R_1$), while the input terminal B is connected to the input line of the first pulse signal $S_1$ (second pulse signal $R_1$) via the delay element $D_{n-1}$.

Further, a delay signal S2 (R2) is output from the output terminal of the selector $SEL_0$ of the final stage.

For example, bit data $C_{n-1}$, $C_{n-2}$, . . . , $C_2$, $C_1$, and $C_0$ of the n-bit control signal S13 (S14) are respectively input to the selected signal input terminals CK of the selectors $SEL_{n-1}$, $SEL_{n-2}$, ..., $SEL_2$, $SEL_1$, and $SEL_0$. Each selector selects the signal of the input terminal A or the input terminal B in accordance with the level of the signal input to the selected signal input terminal and outputs the inverted signal thereof.

For example, when the signal of low level is input to the selected signal input terminal CK, the selector selects the signal input to the input terminal A, inverts this and outputs the same to the output terminal. Conversely, when the signal of high level is input to the selected signal input terminal CK, the selector selects the signal input to the input terminal B, inverts this and outputs the same to the output terminal.

Further, if the delay time of the delay element $D_0$ is $T_D$, the delay time of the delay element $D_i$ becomes $2^i T_D$. For example, the delay time of the delay element $D_{n-1}$ becomes $2^{n-1} T_D$, and the delay time of the delay element $D_1$ becomes $2T_D$.

By the above delay circuit, a delay time of the signal from the input terminal of the first pulse $S_1$ (second pulse signal $R_1$) to the output terminal of the selector $SEL_0$ of the final stage is set in accordance with the levels of the bit data $C_{n-1}$, $C_{n-2}$, ..., $C_2$, $C_1$, and $C_0$ of the control signal S13 (S14).

Figure 3:
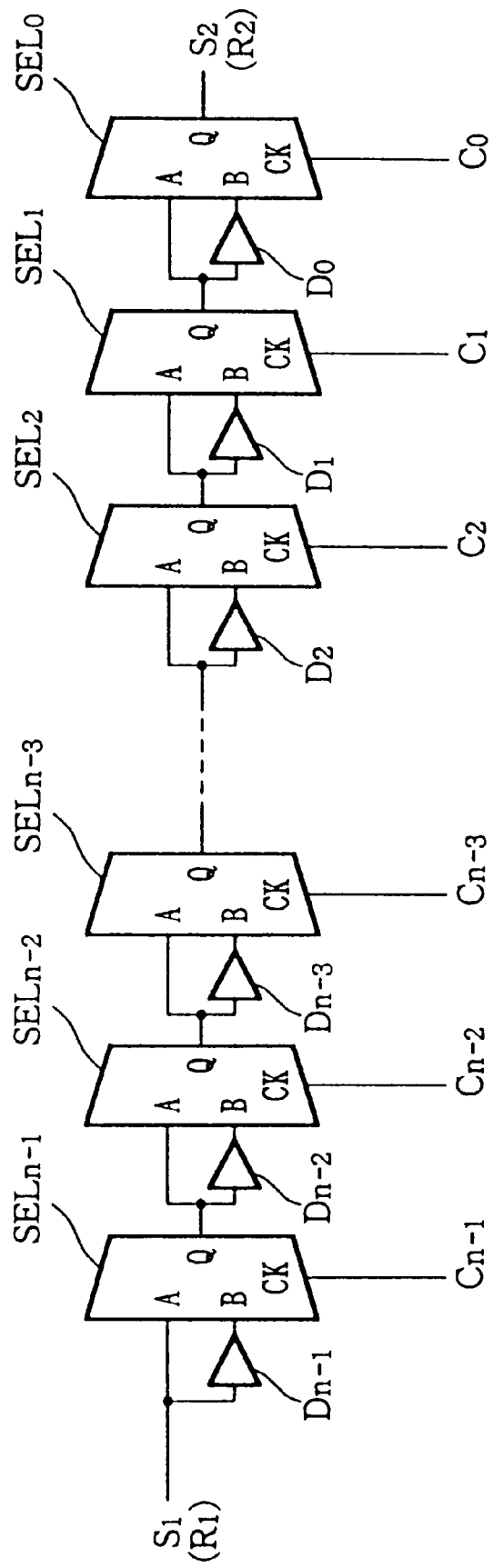
FIG. 3 is a circuit diagram showing a second example of the configuration of the delay circuit according to the present invention.

FIG. 3 is a circuit diagram showing a second example of the configuration of a delay circuit according to the present invention.

The difference of this delay circuit from the circuit shown in FIG. 2 resides in that the selectors $SEL_{n-1}$, $SEL_{n-2}$, ..., $SEL_2$, $SEL_1$, and $SEL_0$ do not invert their outputs and output the same as non-inverted outputs as they are.

The rest of the configuration is similar to that of the circuit of FIG. 2, so a detailed explanation thereof will be omitted.

Figure 4:
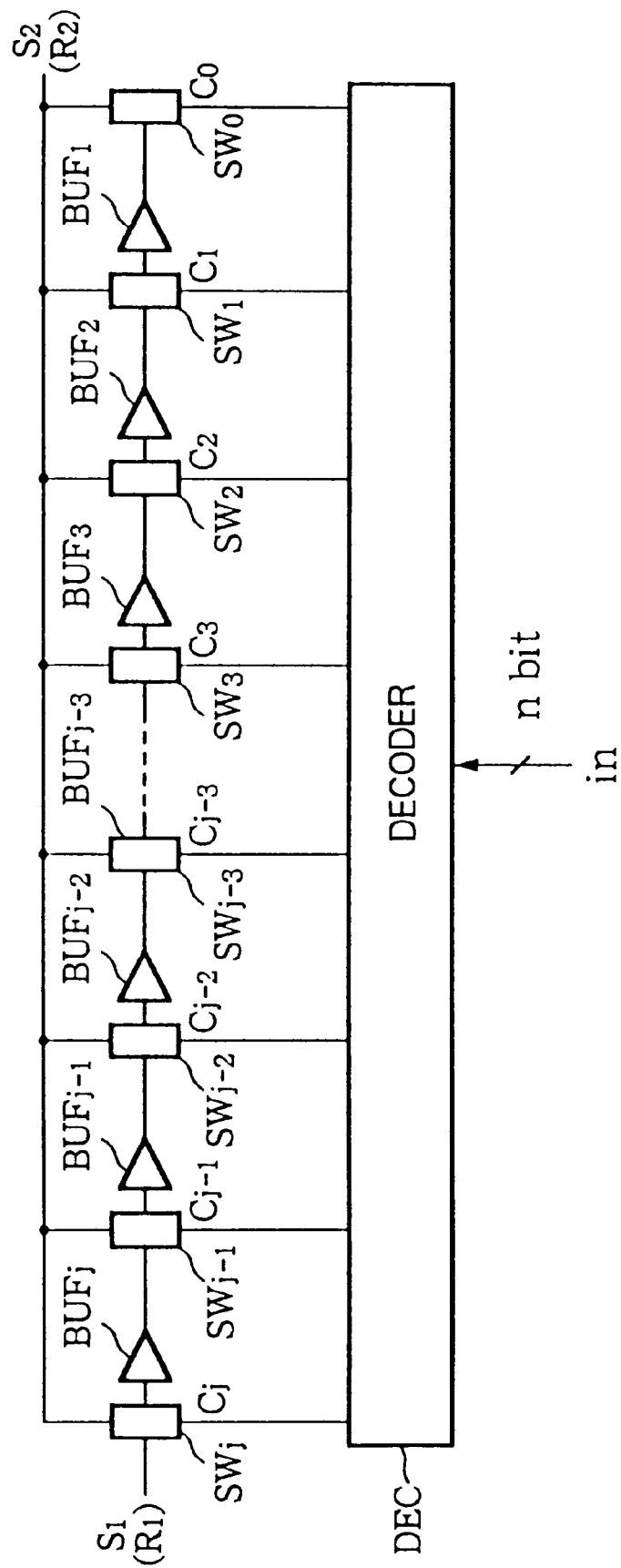
FIG. 4 is a circuit diagram showing a third example of the configuration of the delay circuit according to the present invention.

FIG. 4 is a circuit diagram showing a third example of the configuration of the delay circuit according to the present invention.

This is constituted by an even number of cascade connected buffers $BUF_j$, $BUF_{j-1}$, ..., $BUF_2$, and $BUF_1$, switches $SW_j$, $SW_{j-1}$, ..., $SW_2$, and $SW_1$ arranged at input stages of the buffers, a switch $SW_0$ of a final stage, and a decoder DEC which decodes the n-bit control signal and supplies the bit data $C_{n-1}$, $C_{n-2}$, ..., $C_2$, $C_1$, and $C_0$ for switching the route, that is, outputting them to the next stage of switches $SW_j$, $SW_{j-1}$, ..., $SW_2$, $SW_1$ and $SW_0$ or outputs them as the output signal.

Figure 5:
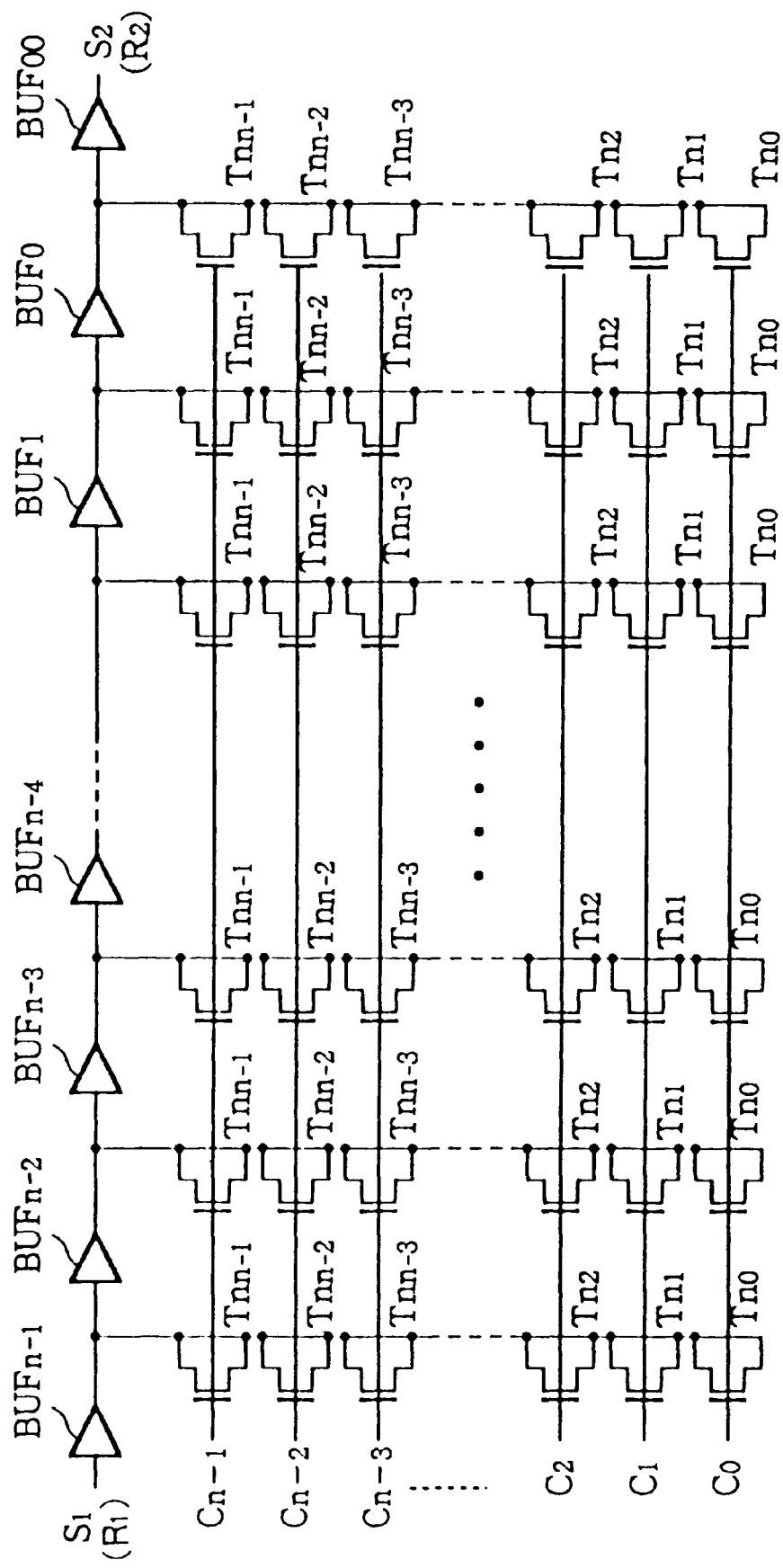
FIG. 5 is a circuit diagram showing a fourth example of the configuration of the delay circuit according to the present invention.
Figure 6:
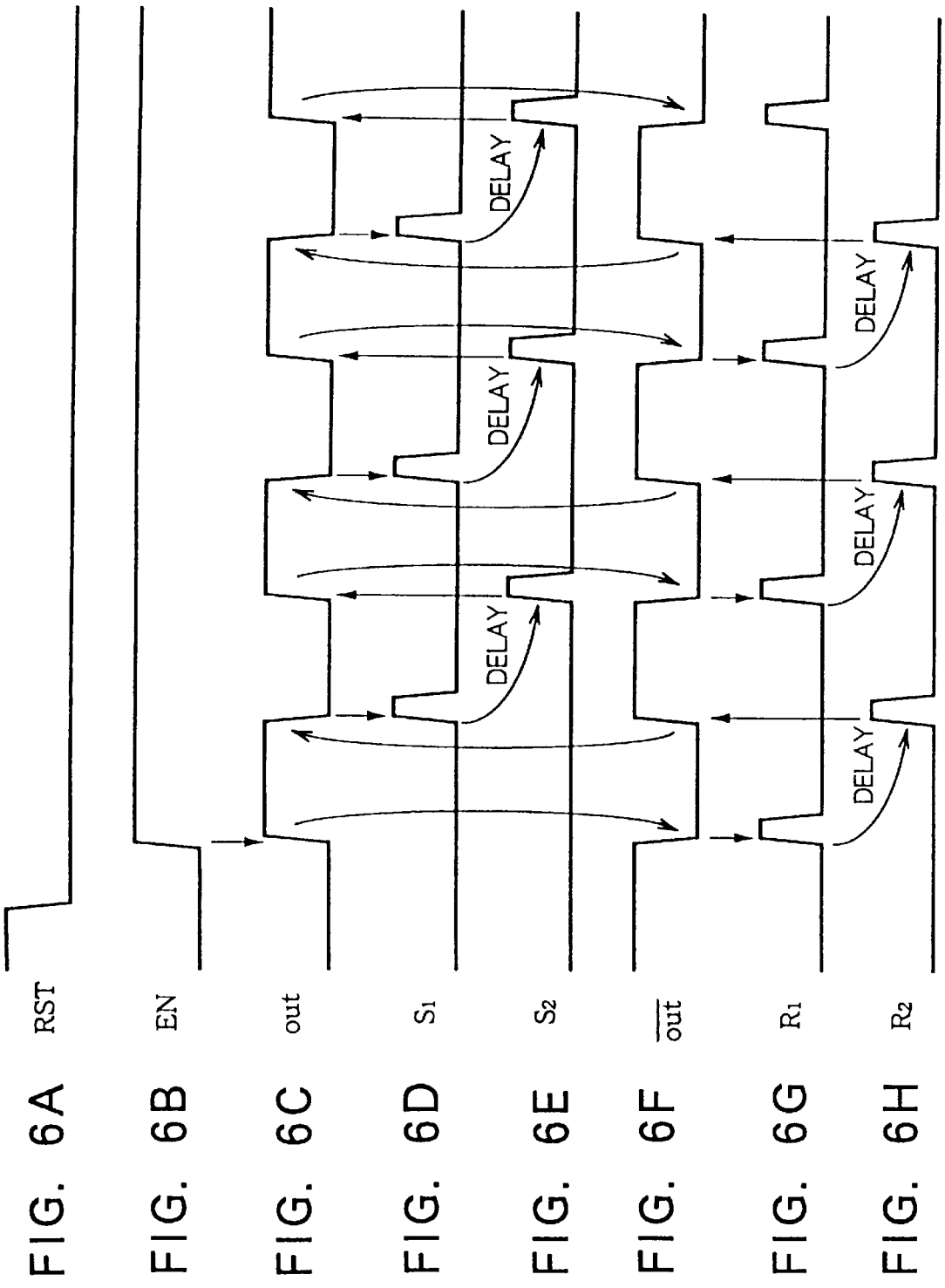
FIGS. 6A to 6H are timing charts for explaining the operation of the circuit of FIG. 1.

FIG. 5 is a circuit diagram showing a fourth example of the configuration of the delay circuit according to the present invention.

As shown in FIG. 5, the delay circuit of the present example is constituted by using a plural stages of delay stages each comprising a buffer and a plurality of capacitors connected to the output terminal thereof. The capacitors of the delay stages are constituted by nMOS transistors.

In FIG. 5, $BUF_{n-1}$, $BUF_{n-2}$, ..., $BUF_2$, $BUF_1$, $BUF_0$, and $BUF_{00}$ indicate buffers, while $Tn_{n-1}$, $Tn_{n-2}$, ..., $Tn_2$, $Tn_1$, and $Tn_0$ indicate nMOS transistors constituting the capacitors.

Note that the buffers $BUF_{n-1}$, $BUF_{n-2}$, ..., $BUF_2$, $BUF_1$, $BUF_0$, and $BUF_{00}$ are constituted by connecting for example two inverters in series.

As illustrated, for example, the i-th delay stage comprises a buffer $BUF_i$ and n number of capacitors connected to the output terminal thereof. These capacitors are constituted by nMOS transistors $Tn_{n-1}$, $Tn_{n-2}$, ..., $Tn_2$, $Tn_1$, and $Tn_0$.

Source and drain diffusion layers of the nMOS transistors are commonly connected to the output terminal of the buffer, the substrate is grounded, and the gate is connected to the input line of the bit data $C_{n-1}$, $C_{n-2}$, ..., $C_2$, $C_1$, and $C_0$ of the control signal S13 (S14). For example, the gate of the nMOS transistor $Tn_{n-1}$ is connected to the input line of the bit data $C_{n-1}$, and the gate of the nMOS transistor $Tn_0$ is connected to the input line of the bit data $C_0$.

For this reason, when a signal of a high level is input to the gate of the nMOS transistor $Tn_i$, a depletion layer is formed between the channel region of the nMOS transistor $Tn_i$ and the substrate and the capacitance of the capacitor becomes large, while conversely when a signal of a low level is input to the gate of the nMOS transistor $Tn_i$, a depletion layer is not formed between the channel region and the substrate and the capacitance of the capacitor becomes small.

The sizes of the nMOS transistors constituting the capacitors of the delay stages are set in accordance with the input bits. For example, the sizes of the transistors are set large in proportion to a power of 2 from the nMOS transistor $Tn_0$ connected to a lower significant bit toward the nMOS transistor $Tn_{n-1}$ connected to an upper significant bit. By this, the capacitances of the constituted capacitors become values proportional to the power of 2.

In the DCO constituted by such delay stages, as shown in FIG. 5, for example, when the bit data $C_{n-1}$ is held at a high level, the capacitance of the nMOS transistor $Tn_{n-1}$ connected to the output terminals of the buffers $BUF_{n-1}$, $BUF_{n-2}$, ..., $BUF_2$, $BUF_1$, and $BUF_0$ becomes large. The delay time of the signal from the input terminal of the first pulse signal $S_1$ (second pulse signal $R_1$) to the input terminal of the buffer $BUF_{00}$ is set large in accordance with the capacitance of the nMOS transistor $Tn_{n-1}$.

The first storage circuit 13 receives the external data DT, updates the value of the data and holds the value immediately before updating when the first output signal "out" of the RS flip-flop 20 is at a first level (low level in the present embodiment), and interrupts the updating of the value and outputs the value updated immediately before this to the first delay circuit 11 as the control signal S13 when the first output signal "out" becomes a second level (high level in the present embodiment).

The second storage circuit 14 receives the external data DT, updates the value of the data and holds the value immediately before updating when the second output signal "/out" (/indicates inversion) of the RS flip-flop 20 is at a low level (first level), and interrupts the updating of value and outputs the value updated immediately before this to the second delay circuit 14 as the control signal S14 when the second output signal "/out" becomes a high level (second level).

The first switching detection circuit 15 generates a first pulse signal $S_1$ and outputs the same to the first delay circuit 11 when detecting a trailing edge of switching of the first output signal "out" of the RS flip-flop 20 from the high level to the low level.

The second switching detection circuit 16 generates a second pulse signal $R_1$ and outputs the same to a second delay circuit 12 when detecting a trailing edge of switching of the second output signal "/out" of the RS flip-flop 20 from the high level to the low level.

The rising edge detection circuit 17 detects the rising edge of the high level active enable signal (first external signal) EN from the outside, generates a pulse signal S17, and outputs the same to the first OR gate circuit 18.

The first OR gate circuit 18 obtains the logical sum of the first delay signal $S_2$ of the first delay circuit 11 and the pulse signal S17 of the rising edge detection circuit 17 and inputs this as a signal S18 to the set terminal S of the RS flip-flop 20.

The second OR gate circuit 19 obtains the logical sum of the first delay signal $R_2$ of the second delay circuit 12 and the reset signal (second external signal) RST from the outside and inputs this as a signal S19 to the reset terminal R of the RS flip-flop 20.

The RS flip-flop 20 switches the first output signal "out" from the low level to the high level and outputs the same from the non-inverted output terminal Q and, switches the second output signal "/out" from the high level to the low level and outputs the same from the inverted output terminal /Q when receiving the output signal S18 of the first OR gate circuit 18, that is, the first delay signal $S_2$, or the pulse signal S17 at the set terminal S actively.

When it receives the output signal S19 of the second OR gate circuit 19, that is, the second delay signal $R_2$ or the reset RST at the reset terminal R actively, it switches the first output signal "out" from the high level to the low level and outputs the same from the non-inverted output terminal Q and, switches the second output signal "/out" from the low level to the high level and outputs the same from the inverted output terminal /Q when receiving the second delay signal $R_2$ or the reset signal RST.

In the digital controlled oscillation circuit 10 having the above configuration, a first oscillation loop circuit is constituted by the non-inverted output terminal Q of the RS flip-flop 20, the first switching detection circuit 15, the first delay circuit 11, and the first OR gate circuit 18, while a second oscillation loop circuit is constituted by the inverted output terminal /Q of the RS flip-flop 20, the second switching detection circuit 16, the second delay circuit 12, and the second OR gate circuit 19.

Next, an explanation will be made of the operation by the above configuration with reference to the timing chart of FIGS. 6A to 6H.

First, the external reset signal RST is input at a high level via the OR gate circuit 19 to the reset terminal R of the RS flip-flop 20.

By this, the RS flip-flop 20 is reset, the first output signal "out" is output at a low level from the non-inverted output terminal Q, and the second output signal "/out" is output at a high level from the inverted output terminal /Q.

In this state, the enable signal EN from the outside to be input to the rising edge detection circuit 17 is switched from the low level to the high level.

In the rising edge detection circuit 17, the rising edge of the enable signal EN is detected and the pulse signal S17 is generated. This is input to the set terminal S of the RS flip-flop 20 via the OR gate circuit 18.

By this, the RS flip-flop 20 is switched to the set state, the first output signal "out" is switched from the low level to the high level and output from the non-inverted output terminal Q to the first switching detection circuit 15, and the second output signal "/out" is switched from the high level to the low level and output to the switching detection circuit 16 from the inverted output terminal /Q.

At this time, since the first output signal "out" is a signal rising from the low level to the high level, the first pulse signal $S_1$ is not generated in the first switching detection circuit 15.

Contrary to this, since the second output signal "/out" is a signal falling from the high level to the low level, the trailing edge thereof is detect at the second switching detection circuit 16. By this, the second pulse signal $R_1$ is generated and output to the second delay circuit 12.

In the second delay circuit 12, the second pulse signal $R_1$ is delayed by exactly the time prescribed by the control signal S14 from the second storage circuit 14 and is input to the reset terminal R of the RS flip-flop 20 via the OR gate circuit 19 as the second delay signal $R_2$.

By this, the RS flip-flop 20 is switched to the reset state, the first output signal "out" is switched from the high level to the low level and output from the non-inverted output terminal Q to the first switching detection circuit 15, and the second output signal "/out" is switched from the low level to the high level and output from the inverted output terminal /Q to the second switching detection circuit 16.

At this time, since the first output signal "out" is a signal falling from the high level to the low level, the trailing edge thereof is detected in the first switching detection circuit 15. By this, the first pulse signal $S_1$ is generated and output to the first delay circuit 11.

Contrary to this, since the second output signal "/out" is a signal rising from the low level to the high level, the second pulse signal $R_1$ is not generated in the second switching detection circuit 16.

In the first delay circuit 11, the first pulse signal Sis delayed by exactly the time prescribed by the control signal S13 from the first storage circuit 13 and is input to the set terminal S of the RS flip-flop 20 via the OR gate circuit 18 as the first delay signal $S_2$.

By this, the RS flip-flop 20 is switched to the set state, the first output signal "out" is switched from the low level to the high level and output from the non-inverted output terminal Q to the first switching detection circuit 15, and the second output signal "/out" is switched from the high level to the low level and output from the inverted output terminal /Q to the second switching detection circuit 16.

At this time, since the first output signal "out" is a signal rising from the low level to the high level, the first pulse signal $S_1$ is not generated in the first switching detection circuit 15.

Contrary to this, since the second output signal "/out" is a signal falling from the high level to the low level, the trailing edge thereof is detected in the second switching detection circuit 16. By this, the second pulse signal $R_1$ is generated and output to the second delay circuit 12.

In the second delay circuit 12, the second pulse signal $R_1$ is delayed by exactly the time prescribed by the control signal S14 from the second storage circuit 14 and input to the reset terminal R of the RS flip-flop 20 via the OR gate circuit 19 as the second delay signal $R_2$.

By this, the RS flip-flop 20 is switched to the reset state, the first output signal "out" is switched from the high level to the low level and output from the non-inverted output terminal Q to the first switching detection circuit 15, and the second output signal "/out" is switched from the low level to the high level and output from the inverted output terminal /Q to the second switching detection circuit 16.

The above operation is repeatedly carried out, so the RS flip-flop 20 acts as the output signal generation circuit and generates a clock signal of a cycle determined by the delay by the first and second delay circuits 11 and 12.

Note that the first and second storage circuits 13 and 14 receive the external data DT and update the values of the data and hold the values immediately before updating when the first output signal "out" and the second output signal "/out" of the RS flip-flop 20 are at the low level. When the first output signal "out" and the second output signal "/out" become the high level, they interrupt the updating of the values and output the values updated immediately before them as the control signals S13 and S14 to the first and second delay circuits 11 and 12.

By this, the control signal changes when the first and second delay circuits 11 and 12 are stable in state, therefore there is no temporary break in the signal path and there is little jitter due to the change of the control signal.

As explained above, according to the first embodiment, since provision is made of the first delay circuit 11 for delaying the first pulse signal $S_1$ of the first switching detection circuit 15 by exactly the delay time set by the control signal S13 of the first storage circuit 13 and outputting the same as the first delay signal $S_2$; the second delay circuit 12 for delaying the second pulse signal $R_1$ of the second switching detection circuit 16 by exactly the delay time set by the control signal S14 of the second storage circuit 14 and outputting the same as the second delay signal $R_2$; the first storage circuit 13 which receives the external data DT, updates the value of the data and holds the value immediately before updating when the first output signal "out" of the RS flip-flop 20 is at the low level, and interrupts the updating of the value and outputs the value updated immediately before this to the first delay circuit 11 as the control signal S13 when the first output signal "out" becomes the high level; the second storage circuit 14 which receives the external data DT, updates the value of the data and holds the value immediately before updating when the second output signal "/out" of the RS flip-flop 20 is at the low level, and interrupts the updating of the value and outputs the value updated immediately before this to the second delay circuit 14 as the control signal S14 when the second output signal "/out" becomes the high level; the first switching detection circuit 15 for generating the first pulse signal $S_1$ and outputting the same to the first delay circuit 11 when detecting the trailing edge at which the first output signal "out" of the RS flip-flop 20 switches from the high level to the low level; the second switching detection circuit 16 for generating the second pulse signal $R_1$ and outputting the same to the second delay circuit 12 when detecting the trailing edge at which the second output signal "/out" of the RS flip-flop 20 switches from the high level to the low level; the RS flip-flop 20 which switches the first output signal "out" from the low level to the high level and outputs the same from the non-inverted output terminal Q and, switches the second output signal "/out" from the high level to the low level and outputs the same from the inverted output terminal /Q when receiving the output signal S18 of the first OR gate circuit 18, that is, the first delay signal $S_2$, or the pulse signal S17 at the set terminal S actively and switches the first output signal "out" from the high level to the low level and outputs the same from the non-inverted output terminal Q and, switches the second output signal "/out" from the low level to the high level and outputs the same from the inverted output terminal /Q when receiving the output signal S19 of the second OR gate circuit 19, that is, the second delay signal $R_2$ or the reset RST at the reset terminal R actively, when receiving the second delay signal $R_2$ or the reset signal RST, it is possible to obtain a DCO which can be controlled in the oscillation frequency of the oscillation circuit in accordance with a digital controlled signal, which has the characteristics of a wide range of the oscillation frequency and a continuous and smooth transition of the frequency, is free from the jitter due to the change of the control signal, and can use a delay circuit of a simple circuit configuration, so has the advantage of a low power consumption.

Second Embodiment

Figure 7:
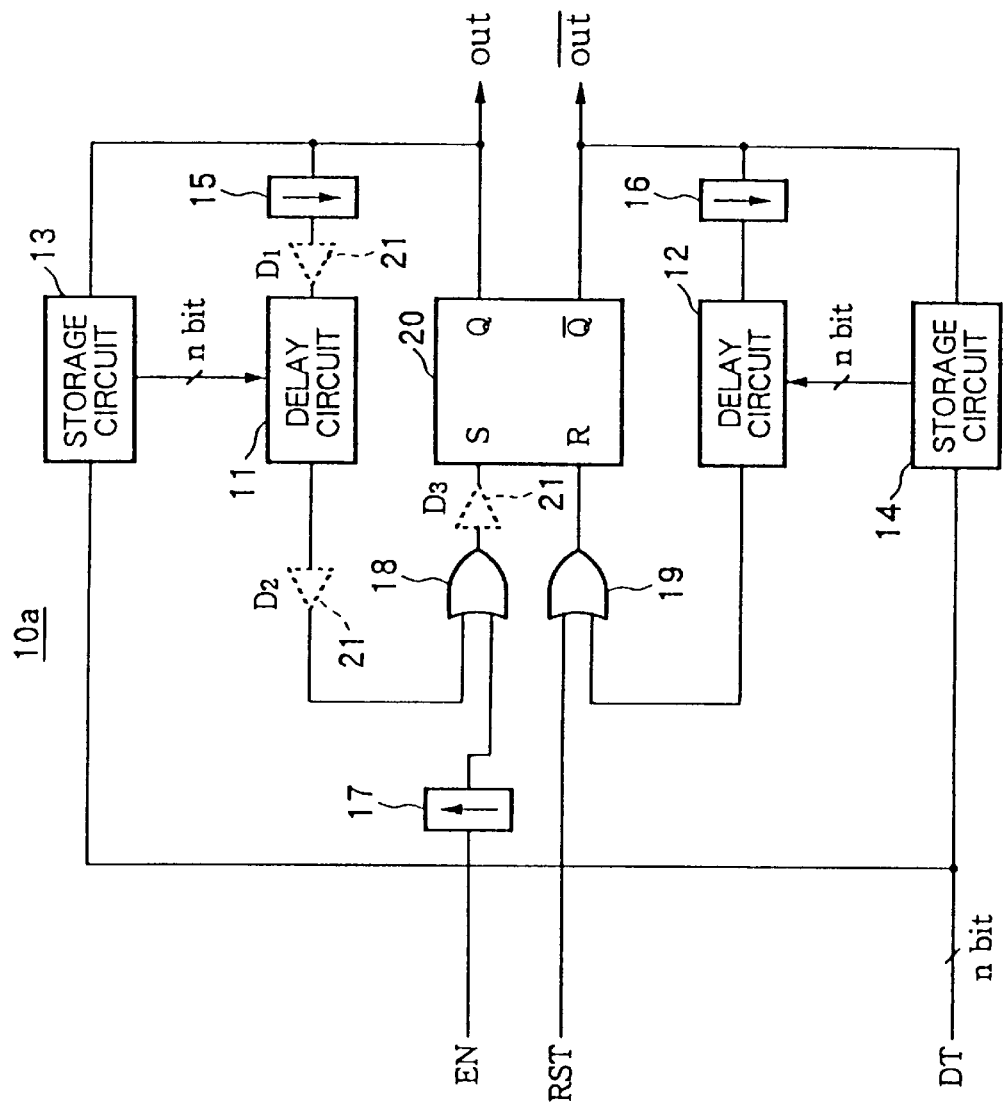
FIG. 7 is a circuit diagram showing a second embodiment of the digital controlled oscillation circuit according to the present invention.

FIG. 7 is a circuit diagram showing a second embodiment of a digital controlled oscillation circuit according to the present invention.

In a digital controlled oscillation circuit 10a of the second embodiment, since there are many cases where the times required for the set and reset operations of the RS flip-flop 20 slightly differ, a circuit for correcting this slight deviation is provided.

Specifically, when mainly considering for example the first output signal "out", since the RS flip-flop 20 is set and then reset, the second output signal "/out" becomes the low level after the first output signal "out" becomes the high level.

For this reason, the period of the high level becomes slightly longer than the period of the low level.

Accordingly, in the example of FIG. 7, a delay element 21 correcting this is inserted at the location of any of D1, D2, and D3 to correct the time so that the period of the high level and the period of the low level become equal.

Note that if the delays for correction are equal in total, it is also possible to insert delay elements at a plurality of positions of D1, D2, and D3.

When mainly considering the second output signal "/out", the reverse structure may be adopted.

According to the second embodiment, in addition to the effect of the first embodiment explained above, there is the advantage that a further higher precision oscillation operation can be realized.

Third Embodiment

Figure 8:
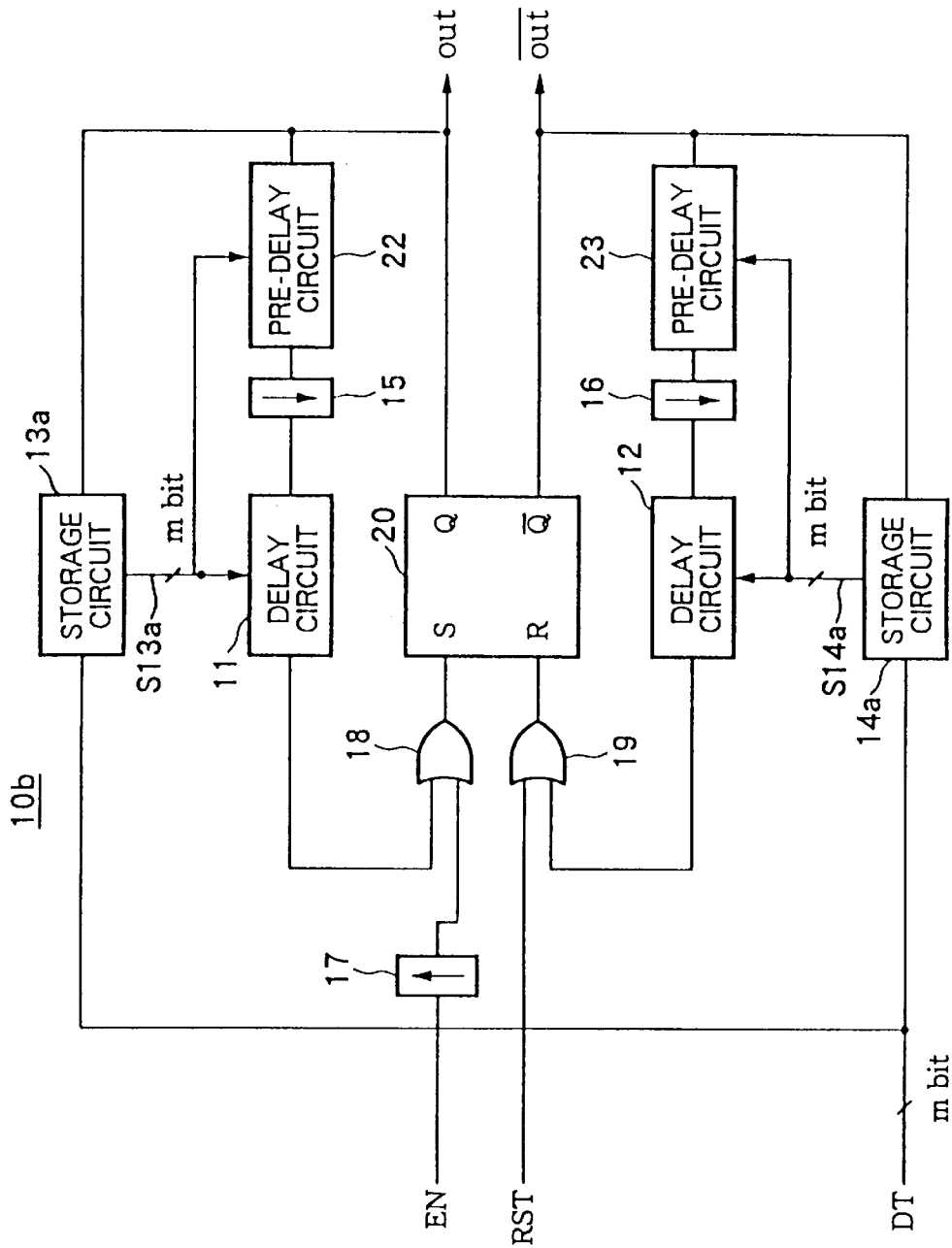
FIG. 8 is a circuit diagram showing a third embodiment of the digital controlled oscillation circuit according to the present invention.

FIG. 8 is a circuit diagram showing a third embodiment of a digital controlled oscillation circuit according to the present invention.

In the third embodiment, where a circuit of the structure using the delay of the gates as shown in FIG. 2 to FIG. 4 mentioned above is used, the smallest step will not be smaller than the smallest delay of the gate, therefore a circuit for interpolating this step is provided.

Specifically, first and second pre-delay circuits 22 and 23 which are controlled in delay times by the control signal S13a of the first storage circuit 13a and the control signal S14a of the second storage circuit 14a are inserted at the input side of the first switching detection circuit 15 detecting the trailing edge of the first output signal "out" and at the input side of the second switching detection circuit 16 detecting the trailing edge of the second output signal "/out".

FIG. 9 to FIG. 12 are circuit diagrams showing examples of the configurations of the first and second pre-delay circuits 22 and 23.

Figure 9:
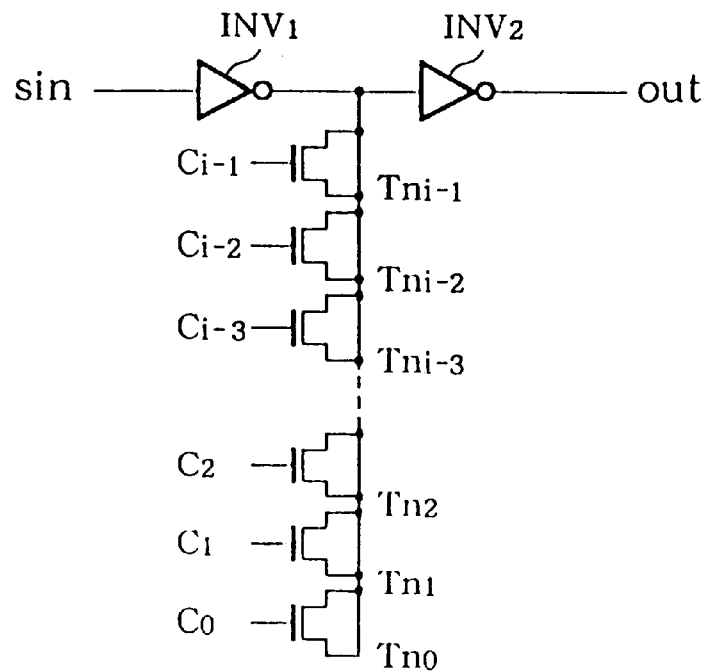
FIG. 9 is a circuit diagram showing a first example of the configuration of a pre-delay circuit according to the present invention.

FIG. 9 is a circuit diagram showing a first example of the configuration of the pre-delay circuit.

As shown in FIG. 9, the pre-delay circuit of the present example is constituted by connecting a delay stage comprised of a plurality of capacitors between two inverters. The capacitors of the delay stage are constituted by nMOS transistors.

In FIG. 9, $INV_1$ and $INV_2$ indicate inverters, and $Tn_{i-1}$, $Tn_{i-2}$, ..., $Tn_2$, $Tn_1$, and $Tn_0$ indicate nMOS transistors constituting the capacitors.

The source and drain diffusion layers of the nMOS transistors are commonly connected to the output terminal of the buffer, the substrate is grounded, and the gate is connected to the input lines of the bit data $C_{n-1}$, $C_{n-2}$, ... $C_2$, $C_1$, and $C_0$ of the control signal S13a (S14a). For example, the gate of the nMOS transistor $Tn_{n-1}$ is connected to the input line of the bit data $C_{n-1}$, and the gate of the nMOS transistor $Tn_0$ is connected to the input line of the bit data $C_0$.

For this reason, when a signal of a high level is input to the gate of the nMOS transistor $Tn_1$, a depletion layer is formed between the channel region of the nMOS transistor $Tn_1$ and the substrate and the capacitance of the capacitor becomes large, while conversely when a signal of a low level is input to the gate of the nMOS transistor $Tn_1$, a depletion layer is not formed between the channel region and the substrate and the capacitance of the capacitor becomes small.

The sizes of the nMOS transistors constituting the capacitors of the delay stage are set in accordance with the input bits. For example, the sizes of the transistors are set large in proportion to a power of 2 from the nMOS transistor $Tn_0$ connected to the lower significant bit toward the nMOS transistor $Tn_{n-1}$ connected to the upper significant bit. By this, the capacitances of the constituted capacitors become values proportional to the power of 2. Namely, they are weighted.

It is possible to control the delay by turning on or off the nMOS transistor gate of the thus weighted delay stage and interpolate the next first delay circuit (second delay circuit).

Figure 10:
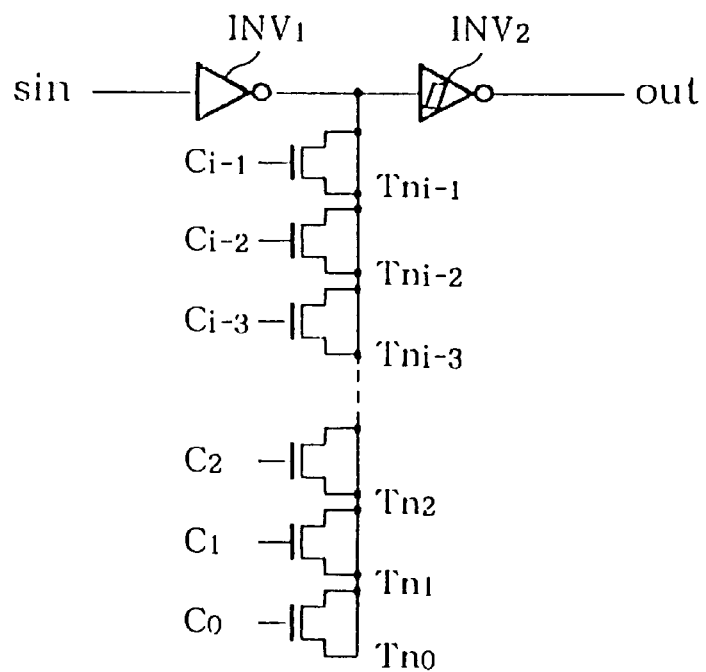
FIG. 10 is a circuit diagram showing a second example of the configuration of the pre-delay circuit according to the present invention.

FIG. 10 is a circuit diagram showing a second example of the configuration of the pre-delay circuit.

As shown in FIG. 10, the difference of the pre-delay circuit of the present example from the circuit of FIG. 9 resides in that a hysteresis characteristic is imparted to the latter stage inverter $INV_2$ so as to further facilitate the interpolation of the delay circuit of the next stage.

Figure 11:
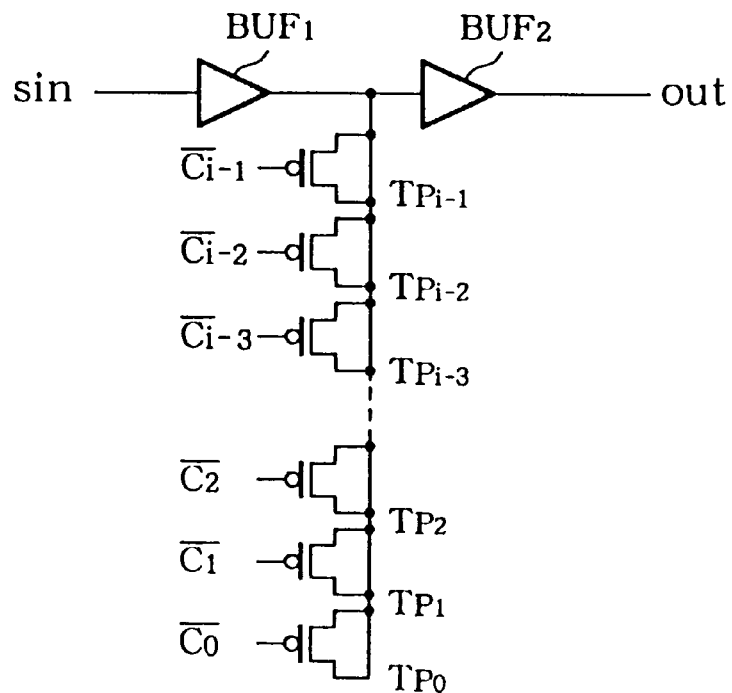
FIG. 11 is a circuit diagram showing a third example of the configuration of the pre-delay circuit according to the present invention.

FIG. 11 is a circuit diagram showing a third example of the configuration of the pre-delay circuit.

As shown in FIG. 11, the difference of the pre-delay circuit of the present example from the circuit of FIG. 9 resides in that pMOS transistors $Tp_{i-1}, Tp_{i-2}, \ldots, Tp_2, Tn_1$, and $Tp_0$ are used in place of the nMOS transistors as the capacitors and that buffers $BUFL$ and $BUF_2$ are used in place of the inverters.

In this case, the inverted data $/C_{i-1}$ to $/C_0$ of the bit data are supplied to the gate electrodes of the pMOS transistors $Tp_{i-1}, Tp_{i-2}, \ldots, TP_2, Tn_1$, and $Tp_0$.

Figure 12:
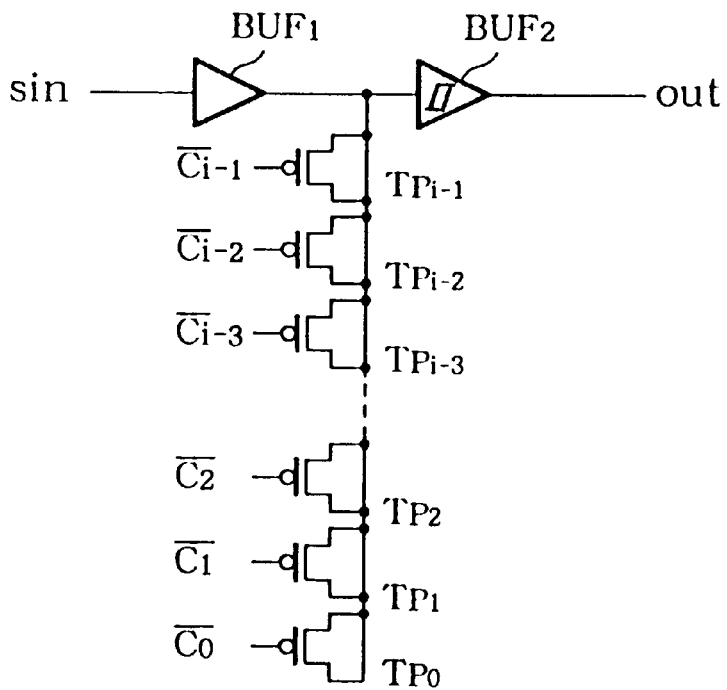
FIG. 12 is a circuit diagram showing a fourth example of the configuration of the pre-delay circuit according to the present invention.

FIG. 12 is a circuit diagram showing a fourth example of the configuration of the pre-delay circuit.

As shown in FIG. 12, the difference of the pre-delay circuit of the present example from the circuit of FIG. 11 resides in that a hysteresis characteristic is imparted to the latter stage buffer $BUF_2$ so as to further facilitate the interpolation of the delay circuit of the next stage.

According to the third embodiment, in addition to the effects of the first embodiment mentioned above, there is the advantage that a more reliable oscillation operation can be realized.

Fourth Embodiment

Figure 13:
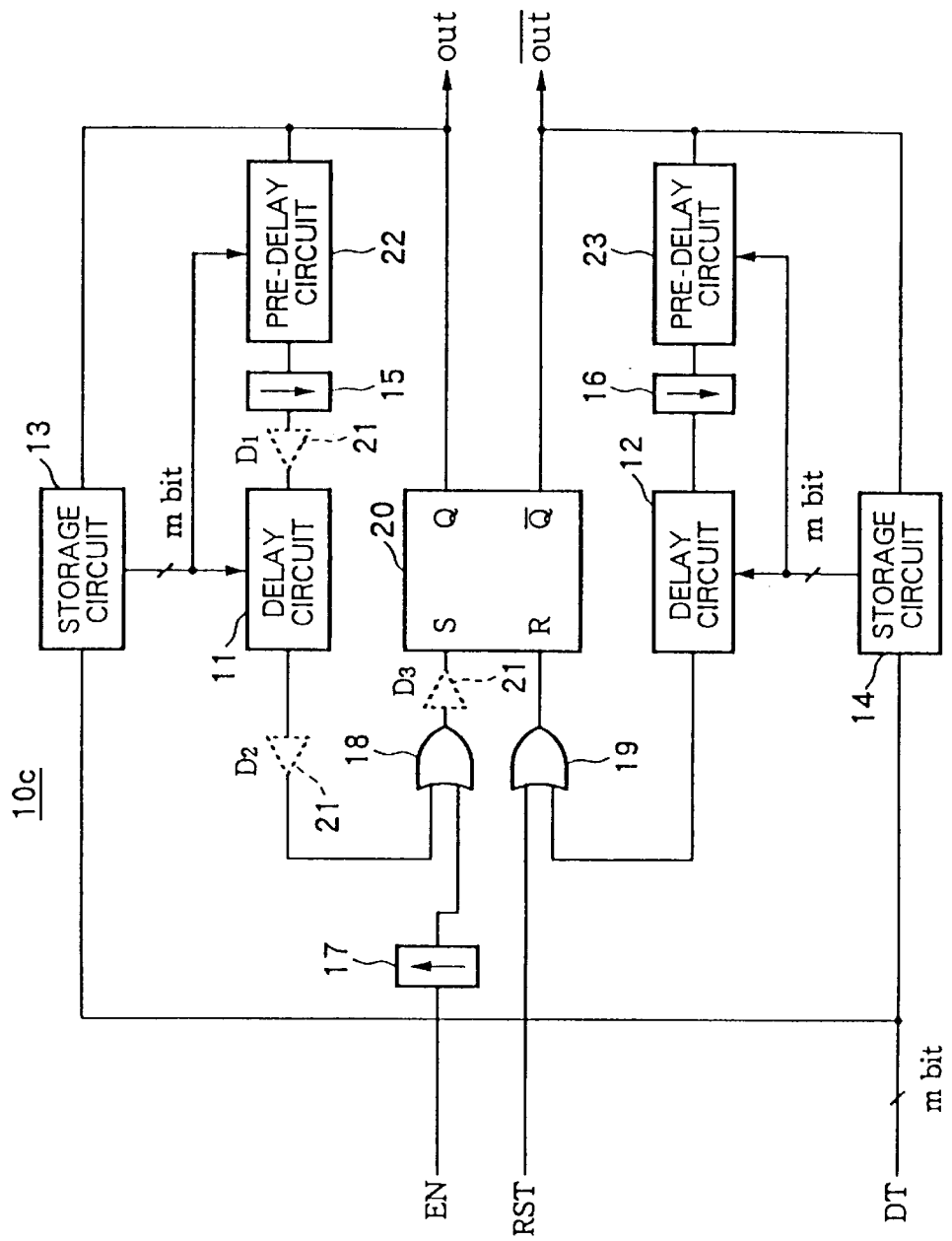
FIG. 13 is a circuit diagram showing a fourth embodiment of the digital controlled oscillation circuit according to the present invention.

FIG. 13 is a circuit diagram showing a fourth embodiment of a digital controlled oscillation circuit according to the present invention.

In a digital controlled oscillation circuit 10c of the fourth embodiment, in the same way as the second embodiment, a circuit for correcting a slight deviation is provided in the configuration of FIG. 8 since there are many cases where the times required for the set and reset operations of the RS flip-flop 20 are slightly different.

Specifically, when mainly considering for example the first output signal "out", since the RS flip-flop is set and then reset, the second output signal "/out" becomes the low level after when the first output signal "out" becomes the high level.

For this reason, the period of the high level becomes slightly longer than the period of the low level.

Accordingly, in the example of FIG. 13, a delay element 21 correcting this is inserted at the location of any of D1, D2 and D3 to correct the times so that the period of the high level and the period of the low level become equal.

Note that if the delays for correction are equal in total, it is also possible to insert delay elements at a plurality of positions of D1, D2, and D3.

When mainly considering the second output signal "/out", the reverse structure may be adopted.

According to the fourth embodiment, in addition to the effects of the third embodiment mentioned above, there is the advantage that a further higher precision oscillation operation can be realized.

Figure 14:
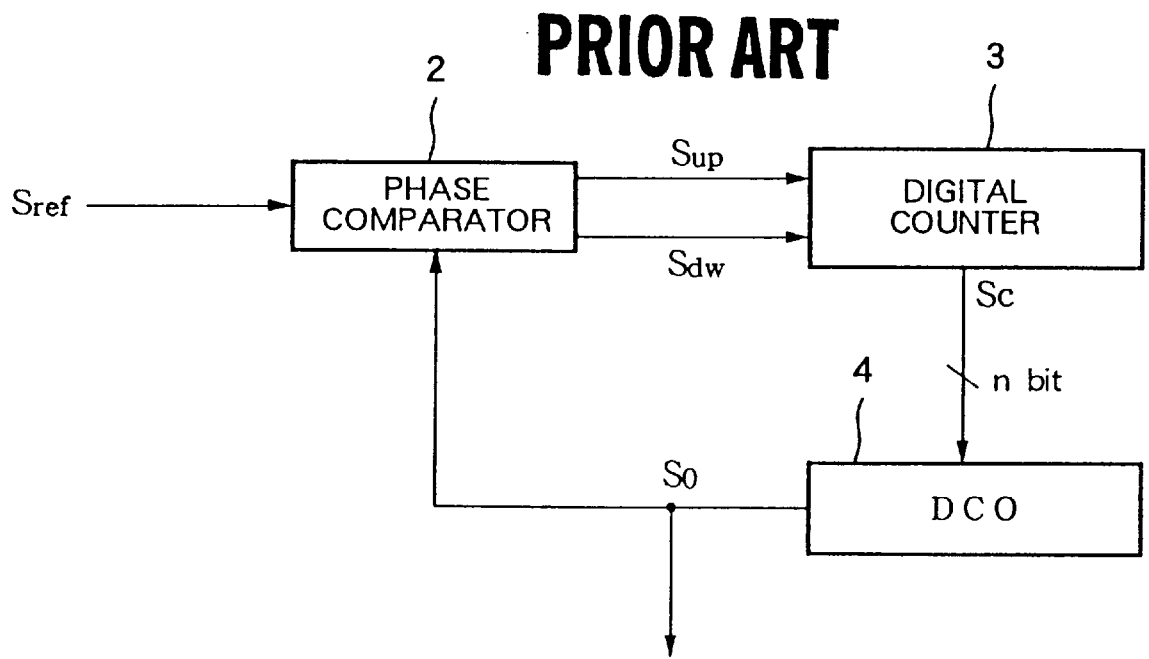
FIG. 14 is a circuit diagram showing an example of a PLL circuit using a digital controlled oscillation circuit.
Figure 15:
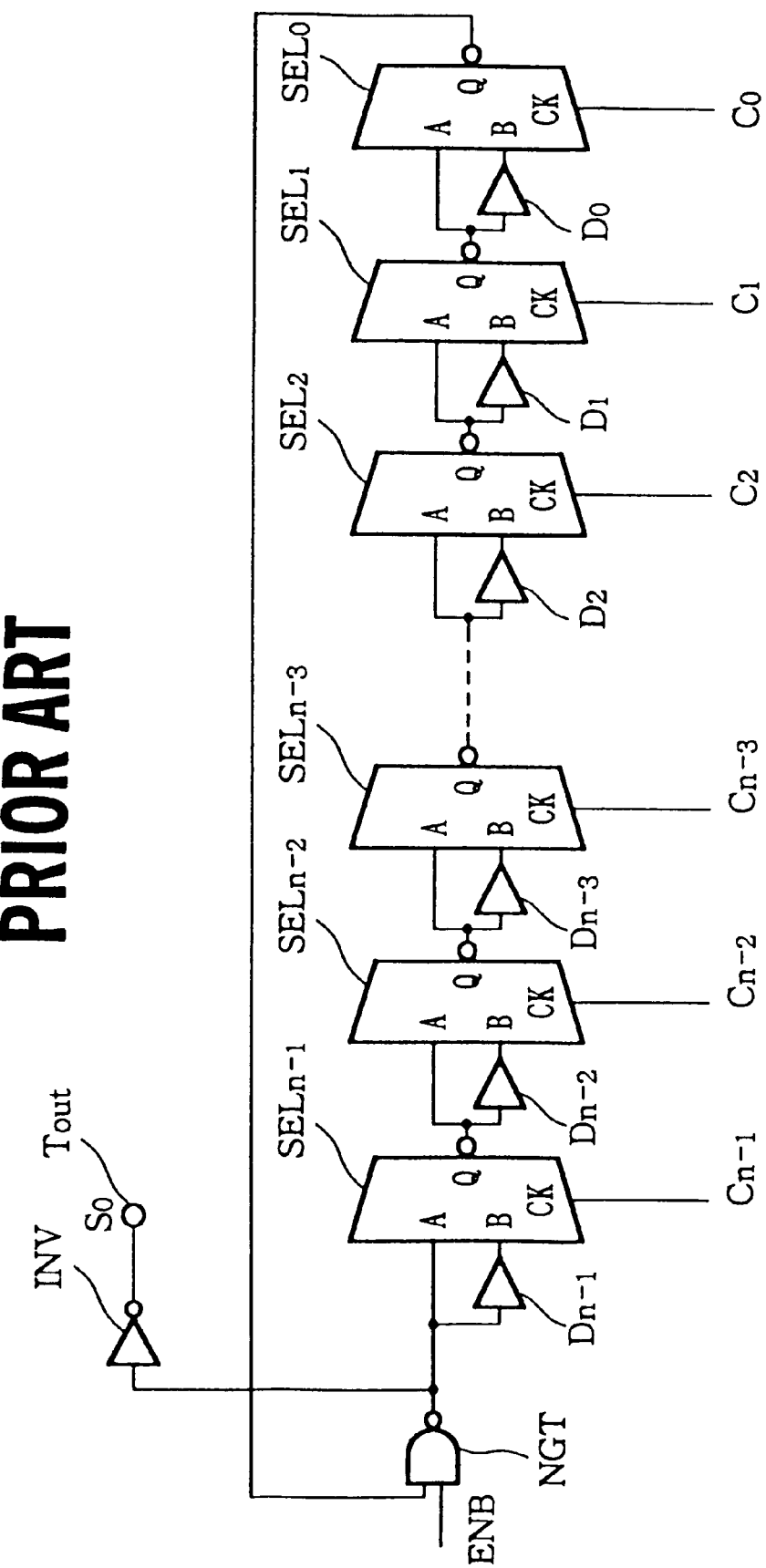
FIG. 15 is a circuit diagram showing an example of the digital controlled oscillation circuit of the related art.
Figure 16:
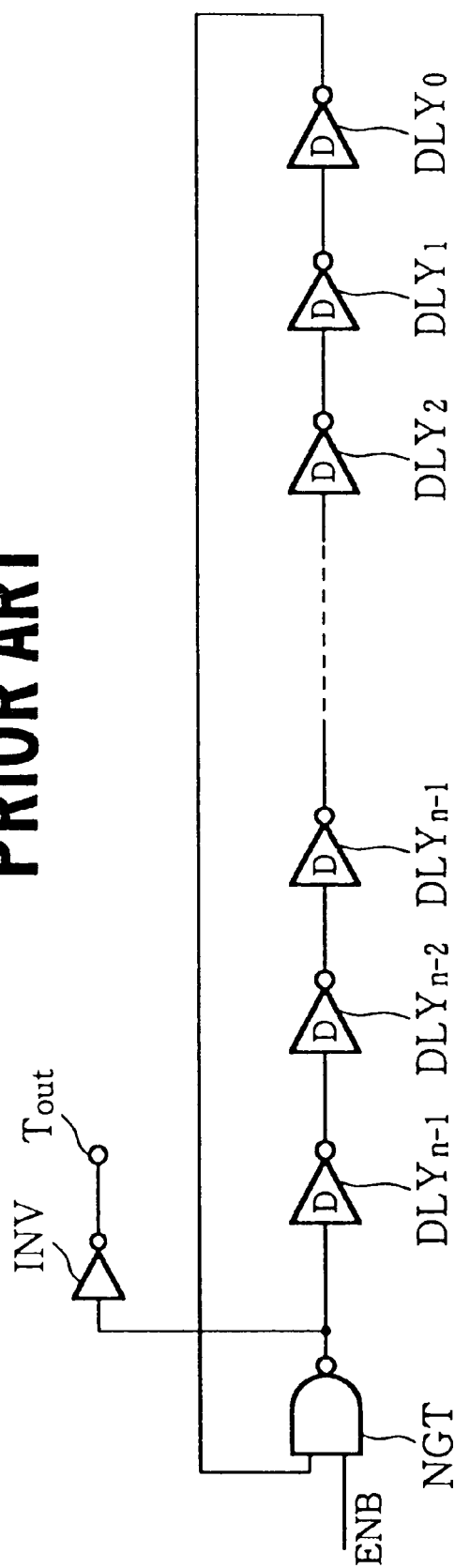
FIG. 16 is a circuit diagram showing an example of the digital controlled oscillation circuit of the related art.
Figure 17:
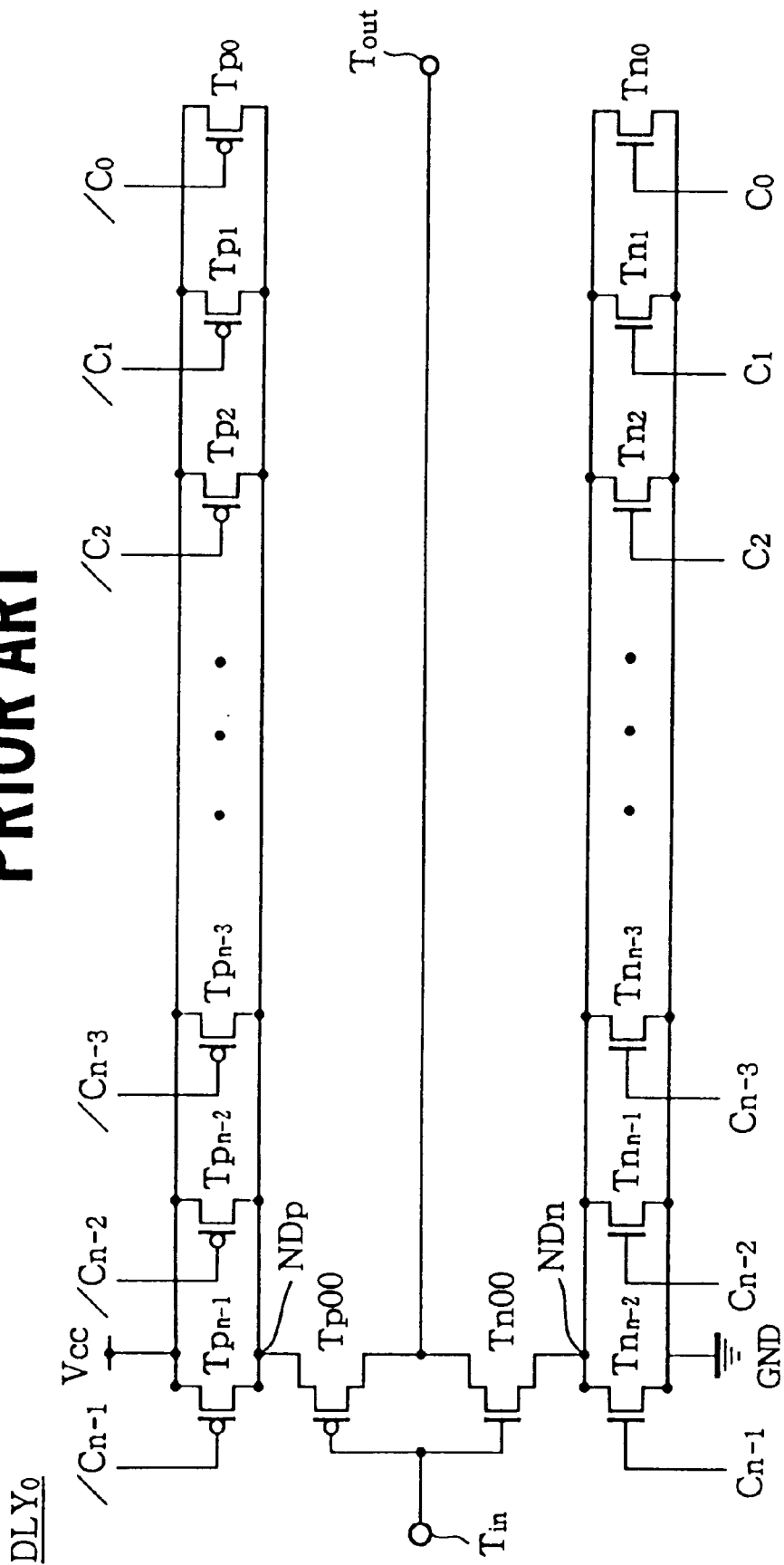
FIG. 17 is a circuit diagram showing the configuration of the delay circuit shown in FIG. 15.

Note that, needless to say, the DCOs according to the embodiments can be applied to the PLL circuit shown in FIG. 14.

As explained above, according to the present invention, it is possible to create a state where the circuit is stable even during operation. By changing the control signal of the delay circuit under this state, it becomes unnecessary to consider the unstable state at the time of switching of the circuit.

As a result, it is possible to control the oscillation frequency of the oscillation circuit in accordance with a digital controlled signal, there are the characteristics of a wide range of the oscillation frequency and a continuous and smooth transition of the frequency, there is no jitter due to the change of the control signal, and it is possible to use a delay circuit of a simple circuit configuration, so there is the advantage of a low power consumption.

While the invention has been described with reference to specific embodiment chosen for purpose of illustration, it should be apparent that numerous modifications could be made thereto by those skilled in the art without departing from the basic concept and scope of the invention.

What is claimed is:

1. A digital controlled oscillation circuit in which the oscillation frequency is controlled in accordance with a control signal, comprising:

a first delay circuit for delaying a first signal by exactly a delay time set by the control signal and outputting the same as a first delay signal;

a second delay circuit for delaying a second signal by exactly the delay time set by the control signal and outputting the same as a second delay signal;

an output signal generation circuit which switches a first output signal from a first level to a second level and outputs the same and, switches a second output signal from the second level to the first level and outputs the same when receiving the first delay signal, while switches the first output signal from the second level to the first level and outputs the same and, switches the second output signal from the first level to the second level and outputs the same when receiving the second delay signal;

a first switching detection circuit for generating the first signal and outputting the same to the first delay circuit when detecting that the first output signal is switched from the second level to the first level; and a second switching detection circuit for generating the second signal and outputting the same to the second delay circuit when detecting that the second output signal is switched from the second level to the first level.

2. A digital controlled oscillation circuit in which the oscillation frequency is controlled in a accordance with a control signal, comprising:

a first delay circuit for delaying a first signal by exactly a delay time set by the control signal and outputting the same as a first delay signal;

a second delay circuit for delaying a second signal by exactly the delay time set by the control signal and outputting the same as a second delay signal;

an output signal generation circuit which switches a first output signal from a first level to a second level and outputs the same and, switches a second output signal from the second level to the first level and outputs the same when receiving the first delay signal, while switches the first output signal from the second level to the first level and outputs the same and, switches the second output signal from the first level to the second level and outputs the same when receiving the second delay signal;

a first switching detection circuit for generating the first signal and outputting the same to the first delay circuit when detecting that the first output signal is switched from the second level to the first level;

a second switching detection circuit for generating the second signal and outputting the same to the second delay circuit when detecting that the second output signal is switched from the second level to the first level;

the control signal is an n (n is a positive integer) bits digital signal; and the first and second delay circuits are comprised of cascade connections of numbers of delay elements provided corresponding to the number of bits of the control signal and controlled in delay time in accordance with the corresponding n-bit data.

3. A digital controlled oscillation circuit as set forth in claim 1, wherein the output signal generation circuit is constituted by a reset-set (RS) type flip-flop which receives as input the first delay signal at a set terminal, outputs the first output signal from a non-inverted output terminal, and outputs the second output signal from an inverted output terminal.

4. A digital controlled oscillation circuit as set forth in claim 3, further comprising:

a circuit for correcting a deviation of times taken in the set and reset operations of the RS type flip-flop.

5. A digital controlled oscillation circuit in which the oscillation frequency is controlled in a accordance with a control signal, comprising:

a first delay circuit for delaying a first signal by exactly a delay time set by the control signal and outputting the same as a first delay signal;

a second delay circuit for delaying a second signal by exactly the delay time set by the control signal and outputting the same as a second delay signal;

an output signal generation circuit which switches a first output signal from a first level to a second level and outputs the same and, switches a second output signal from the second level to the first level and outputs the same when receiving the first delay signal, while switches the first output signal from the second level to the first level and outputs the same and, switches the second output signal from the first level to the second level and outputs the same when receiving the second delay signal;

a first switching detection circuit for generating the first signal and outputting the same to the first delay circuit when detecting that the first output signal is switched from the second level to the first level;

a second switching detection circuit for generating the second signal and outputting the same to the second delay circuit when detecting that the second output signal is switched from the second level to the first level;

a gate circuit for inputting the first delay signal or a first external signal to the output signal generation circuit; and said output signal generation circuit switching the first output signal from the first level to the second level and outputting the same and, switching the second output signal from the second level to the first level and outputting the same when receiving the first delay signal or first external signal.

6. A digital controlled oscillation circuit in which the oscillation frequency is controlled in a accordance with a control signal, comprising:

a first delay circuit for delaying a first signal by exactly a delay time set by the control signal and outputting the same as a first delay signal;

a second delay circuit for delaying a second signal by exactly the delay time set by the control signal and outputting the same as a second delay signal;

an output signal generation circuit which switches a first output signal from a first level to a second level and outputs the same and, switches a second output signal from the second level to the first level and outputs the same when receiving the first delay signal, while switches the first output signal from the second level to the first level and outputs the same and, switches the second output signal from the first level to the second level and outputs the same when receiving the second delay signal;

a first switching detection circuit for generating the first signal and outputting the same to the first delay circuit when detecting that the first output signal is switched from the second level to the first level;

a second switching detection circuit for generating the second signal and outputting the same to the second delay circuit when detecting that the second output signal is switched from the second level to the first level;

a gate circuit for inputting the second delay signal or a second external signal to the output signal generation circuit; and said output signal generation circuit switching the first output signal from the second level to the first level and outputting the same and, switching the second output signal from the first level to the second level and outputting the same when receiving the second delay signal or second external signal.

7. A digital controlled oscillation circuit in which the oscillation frequency is controlled in a accordance with a control signal, comprising:

a first delay circuit for delaying a first signal by exactly a delay time set by the control signal and outputting the same as a first delay signal;

a second delay circuit for delaying a second signal by exactly the delay time set by the control signal and outputting the same as a second delay signal;

an output signal generation circuit which switches a first output signal from a first level to a second level and outputs the same and, switches a second output signal from the second level to the first level and outputs the same when receiving the first delay signal, while switches the first output signal from the second level to the first level and outputs the same and, switches the second output signal from the first level to the second level and outputs the same when receiving the second delay signal;

a first switching detection circuit for generating the first signal and outputting the same to the first delay circuit when detecting that the first output signal is switched from the second level to the first level;

a second switching detection circuit for generating the second signal and outputting the same to the second delay circuit when detecting that the second output signal is switched from the second level to the first level;

a first gate circuit for inputting the first delay signal or a first external signal to the output signal generation circuit and a second gate circuit for inputting the second delay signal or a second external signal to the output signal generation circuit and said output signal generation circuit switching the first output signal from the first level to the second level and outputting the same and switches the second output signal from the second level to the first level and outputting the same when receiving the first delay signal or the first external signal and switching the first output signal from the second level to the first level and outputting the same and switching the second output signal from the first level to the second level and outputting the same when receiving the second delay signal or the second external signal.

8. A digital controlled oscillation circuit in which the oscillation frequency is controlled in a accordance with a control signal, comprising:

a first delay circuit for delaying a first signal by exactly a delay time set by the control signal and outputting the same as a first delay signal;

a second delay circuit for delaying a second signal by exactly the delay time set by the control signal and outputting the same as a second delay signal;

an output signal generation circuit which switches a first output signal from a first level to a second level and outputs the same and, switches a second output signal from the second level to the first level and outputs the same when receiving the first delay signal, while switches the first output signal from the second level to the first level and outputs the same and, switches the second output signal from the first level to the second level and outputs the same when receiving the second delay signal;

a first switching detection circuit for generating the first signal and outputting the same to the first delay circuit when detecting that the first output signal is switched from the second level to the first level;

a second switching detection circuit for generating the second signal and outputting the same to the second delay circuit when detecting that the second output signal is switched from the second level to the first level;

a storage circuit which receives external data, updates the value of the data and holds the value immediately before the updating when the first output signal is at the first level, and interrupts the updating of the value and outputs the value updated immediately before this as the control signal to the first delay circuit when the first output signal becomes the second level.

9. A digital controlled oscillation circuit in which the oscillation frequency is controlled in a accordance with a control signal, comprising:

a first delay circuit for delaying a first signal by exactly a delay time set by the control signal and outputting the same as a first delay signal;

a second delay circuit for delaying a second signal by exactly the delay time set by the control signal and outputting the same as a second delay signal;

an output signal generation circuit which switches a first output signal from a first level to a second level and outputs the same and, switches a second output signal from the second level to the first level and outputs the same when receiving the first delay signal, while switches the first output signal from the second level to the first level and outputs the same and, switches the second output signal from the first level to the second level and outputs the same when receiving the second delay signal;

a first switching detection circuit for generating the first signal and outputting the same to the first delay circuit when detecting that the first output signal is switched from the second level to the first level;

a second switching detection circuit for generating the second signal and outputting the same to the second delay circuit when detecting that the second output signal is switched from the second level to the first level;

a storage circuit which receives external data, updates the value of the data and holds the value immediately before the updating when the second output signal is at the first level; and interrupts the updating of the value and outputs the value updated immediately before this as the control signal to the second delay circuit when the second output signal becomes the second level.

10. A digital controlled oscillation circuit in which the oscillation frequency is controlled in a accordance with a control signal, comprising:

a first delay circuit for delaying a first signal by exactly a delay time set by the control signal and outputting the same as a first delay signal;

a second delay circuit for delaying a second signal by exactly the delay time set by the control signal and outputting the same as a second delay signal;

an output signal generation circuit which switches a first output signal from a first level to a second level and outputs the same and, switches a second output signal from the second level to the first level and outputs the same when receiving the first delay signal, while switches the first output signal from the second level to the first level and outputs the same and, switches the second output signal from the first level to the second level and outputs the same when receiving the second delay signal;

a first switching detection circuit for generating the first signal and outputting the same to the first delay circuit when detecting that the first output signal is switched from the second level to the first level;

a second switching detection circuit for generating the second signal and outputting the same to the second delay circuit when detecting that the second output signal is switched from the second level to the first level;

a first storage circuit which receives external data, updates the value of the data and holds the value immediately before the updating when the first output signal is at the first level, and interrupts the updating of the value and outputs the value updated immediately before this as the control signal to the first delay circuit when the first output signal becomes the second level; and a second storage circuit which also receives said external data, updates the value of the data and holds the value immediately before the updating when the second output signal is at the first level, and interrupts the updating of the value and outputs the value updated immediately before this as the control signal to the second delay circuit when the second output signal becomes the second level.

11. A digital controlled oscillation circuit in which the oscillation frequency is controlled in a accordance with a control signal, comprising:

a first delay circuit for delaying a first signal by exactly a delay time set by the control signal and outputting the same as a first delay signal;

a second delay circuit for delaying a second signal by exactly the delay time set by the control signal and outputting the same as a second delay signal;

an output signal generation circuit which switches a first output signal from a first level to a second level and outputs the same and, switches a second output signal from the second level to the first level and outputs the same when receiving the first delay signal, while switches the first output signal from the second level to the first level and outputs the same and, switches the second output signal from the first level to the second level and outputs the same when receiving the second delay signal;

a first switching detection circuit for generating the first signal and outputting the same to the first delay circuit when detecting that the first output signal is switched from the second level to the first level;

a second switching detection circuit for generating the second signal and outputting the same to the second delay circuit when detecting that the second output signal is switched from the second level to the first level; and a pre-delay circuit for performing interpolation of the delay time at least at one input side of the first delay circuit and the second delay circuit.

12. A PLL circuit comprising:

a phase comparator for comparing phases of a reference signal and an oscillation signal and generating an up signal or a down signal in accordance with the result of comparison;

a digital counter which receives the up signal or down signal from the phase comparator and generates n-bit count data in accordance with the up and down signals; and a digital controlled oscillation circuit comprising a first delay circuit for delaying a first signal by exactly a delay time set by the count data by the digital counter and outputting the same as a first delay signal;

a second delay circuit for delaying a second signal by exactly the delay time set by the count data by the digital counter and outputting the same as a second delay signal;

an output signal generation circuit which switches a first output signal from a first level to a second level and outputs the same and, switches a second output signal from the second level to the first level and outputs the same when receiving the first delay signal, while switches the first output signal from the second level to the first level and outputs the same and, switches the second output signal from the first level to the second level and outputs the same when receiving the second delay signal;

a first switching detection circuit for generating the first signal and outputting the same to the first delay circuit when detecting that the first output signal is switched from the second level to the first level;

and a second switching detection circuit for generating the second signal and outputting the same to the second delay circuit when detecting that the second output signal is switched from the second level to the first level.

* * * * *